(12) United States Patent
Kim et al.

(10) Patent No.: US 9,077,385 B2
(45) Date of Patent: Jul. 7, 2015

(54) METHOD AND DEVICE FOR RECEIVING DOWNLINK SIGNAL

(75) Inventors: Hakseong Kim, Anyang-si (KR); Hanbyul Seo, Anyang-si (KR); Byounghoon Kim, Anyang-si (KR); Kijun Kim, Anyang-si (KR); Daewon Lee, Anyang-si (KR)

(73) Assignee: LG ELECTRONICS INC., Seoul (KR)

( * ) Notice: Subject to any disclaimer, the term of this patent is extended or adjusted under 35 U.S.C. 154(b) by 191 days.

(21) Appl. No.: 13/641,689

(22) PCT Filed: Apr. 15, 2011

(86) PCT No.: PCT/KR2011/002704
§ 371 (c)(1),
(2), (4) Date: Oct. 16, 2012

(87) PCT Pub. No.: WO2011/129650
PCT Pub. Date: Oct. 20, 2011

(65) Prior Publication Data
US 2013/0034072 A1    Feb. 7, 2013

Related U.S. Application Data

(60) Provisional application No. 61/324,762, filed on Apr. 16, 2010, provisional application No. 61/327,086, filed on Apr. 22, 2010, provisional application No. 61/382,471, filed on Sep. 13, 2010.

(51) Int. Cl.
*H04W 72/04* (2009.01)
*H03M 13/37* (2006.01)
*H03M 13/00* (2006.01)
*H04L 1/00* (2006.01)
*H04L 5/00* (2006.01)

(52) U.S. Cl.
CPC ...... *H03M 13/3738* (2013.01); *H03M 13/6525* (2013.01); *H03M 13/6527* (2013.01); *H03M 13/653* (2013.01); *H03M 13/6536* (2013.01); *H03M 13/6544* (2013.01); *H04L 1/0091* (2013.01); *H04L 5/0007* (2013.01); *H04L 5/0053* (2013.01); *H04L 5/0091* (2013.01)

(58) Field of Classification Search
USPC .......................................... 370/341, 322, 329
See application file for complete search history.

(56) References Cited

U.S. PATENT DOCUMENTS

2011/0243059 A1*  10/2011  Liu et al. ........................ 370/315

FOREIGN PATENT DOCUMENTS

| KR | 1020080096358 | 10/2008 |
| KR | 1020090101043 | 9/2009 |
| KR | 1020100032813 | 3/2010 |

* cited by examiner

*Primary Examiner* — Dang Ton
*Assistant Examiner* — Pamit Kaur
(74) *Attorney, Agent, or Firm* — Lee, Hong, Degerman, Kang & Waimey

(57) ABSTRACT

The present invention relates to a method and a device for receiving a downlink control signal in a wireless communication system. More specifically, the present invention relates to a device and a method for receiving control information, the method comprising the following steps: receiving a subframe which includes two slots; executing a blind decoding for a first control channel in the control channel search region within a first slot; decoding a second control channel using a specific resource within a second slot when the first control channel has been detected; and executing a blind decoding for the second control channel in the control channel search region within the second slot when the first control channel has not been detected.

8 Claims, 21 Drawing Sheets

(a)

(b)

METHOD AND DEVICE FOR RECEIVING DOWNLINK SIGNAL

CROSS-REFERENCE TO RELATED APPLICATIONS

This application is the National Stage filing under 35 U.S.C. 371 of International Application No. PCT/KR2011/002704, filed on Apr. 15, 2011, which claims the benefit of U.S. Provisional Application Ser. No. 61/324,762, filed on Apr. 16, 2010, U.S. Provisional Application Ser. No. 61/327,086, filed on Apr. 22, 2010, and U.S. Provisional Application Ser. No. 61/382,471, filed on Sep. 13, 2010, the contents of which are all hereby incorporated by reference herein in their entirety.

TECHNICAL FIELD

The present invention relates to a wireless communication system, and more particularly, to a method and apparatus for receiving a downlink signal.

BACKGROUND ART

Wireless access systems have been widely deployed in order to provide various types of communication services including voice or data. In general, a wireless access system is a multiple access system that can support communication among multiple users by allowing them to share available system resources (a bandwidth, transmission power, etc.). Examples of multiple access systems include Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), Multi Carrier Frequency Division Multiple Access (MC-FDMA), etc.

DISCLOSURE

Technical Problem

An object of the present invention devised to solve the conventional problem is to provide a method and apparatus for efficiently using downlink resources in a wireless communication system.

It will be appreciated by persons skilled in the art that the objects that could be achieved with the present invention are not limited to what has been particularly described hereinabove and the above and other objects that the present invention could achieve will be more clearly understood from the following detailed description.

Technical Solution

In an aspect of the present invention, a method for receiving downlink control information in a wireless communication system includes receiving a subframe including two slots, performing blind decoding for a first control channel in a control channel search space of a first slot, decoding a second control channel using predetermined resources in a second slot, when the first control channel has been detected, and performing blind decoding for the second control channel in a control channel search space of the second slot, when the first control channel has not been detected.

In another aspect of the present invention, a communication apparatus for receiving downlink control information in a wireless communication system includes a Radio Frequency (RF) unit, and a microprocessor. The microprocessor is configured to receive a subframe including two slots, perform blind decoding for a first control channel in a control channel search space of a first slot, decode a second control channel using predetermined resources in a second slot, when the first control channel has been detected, and perform blind decoding for the second control channel in a control channel search space of the second slot, when the first control channel has not been detected.

Preferably, the predetermined resources include the second slot of a resource block pair in which the first control channel has been detected.

Preferably, the predetermined resources are indicated by the first control channel.

Preferably, the control channel spaces of the first and second slots are configured independently.

Preferably, the first control channel carries a downlink grant and the second control channel carries an uplink grant.

Advantageous Effects

According to the embodiments of the present invention, downlink resources can be efficiently used in a wireless communication system.

It will be appreciated by persons skilled in the art that the effects that can be achieved with the present invention are not limited to what has been particularly described hereinabove and other advantages of the present invention will be more clearly understood from the following detailed description taken in conjunction with the accompanying drawings.

BRIEF DESCRIPTION OF THE DRAWINGS

The accompanying drawings, which are included to provide a further understanding of the invention, illustrate embodiments of the invention and together with the description serve to explain the principle of the invention.

In the drawings.

BEST MODE FOR CARRYING OUT THE INVENTION

The configuration, operation, and other features of the present invention will readily be understood with embodiments of the present invention described with reference to the attached drawings. Embodiments of the present invention are applicable to a variety of wireless access technologies such as Code Division Multiple Access (CDMA), Frequency Division Multiple Access (FDMA), Time Division Multiple Access (TDMA), Orthogonal Frequency Division Multiple Access (OFDMA), Single Carrier Frequency Division Multiple Access (SC-FDMA), and Multi Carrier Frequency Division Multiple Access (MC-FDMA). CDMA can be implemented into a radio technology such as Universal Terrestrial Radio Access (UTRA) or CDMA2000. TDMA can be implemented into a radio technology such as Global System for Mobile communications (GSM)/General Packet Radio Service (GPRS)/Enhanced Data Rates for GSM Evolution (EDGE). OFDMA can be implemented as a wireless technology such as Institute of Electrical and Electronics Engineers (IEEE) 802.11 (Wireless Fidelity (Wi-Fi)), IEEE 802.16 (Worldwide interoperability for Microwave Access (WiMAX)), IEEE 802.20, Evolved UTRA (E-UTRA). UTRA is a part of Universal Mobile Telecommunications System (UMTS). 3$^{rd}$ Generation Partnership Project Long Term Evolution (3GPP LTE) is a part of Evolved UMTS (E-UMTS) using E-UTRA. LTE-Advanced (LTE-A) is an evolution of 3GPP LTE.

While the following description is given of embodiments of the present invention with the appreciation that the technical features of the present invention are applied to a 3GPP system, this is purely exemplary and thus should not be construed as limiting the present invention.

Figure 1:
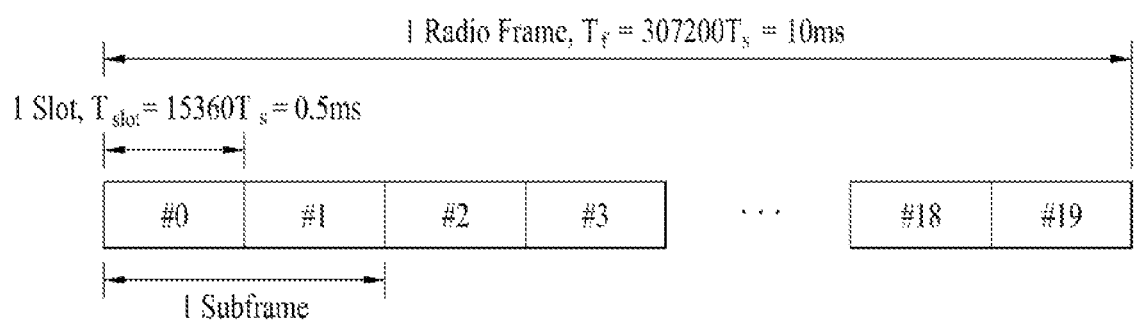
FIG. 1 illustrates the structure of a radio frame in a $3^{rd}$ Generation Partnership Project (3GPP) system.

FIG. 1 illustrates a radio frame structure in the 3GPP system.

Referring to FIG. 1, a radio frame is 10 ms (307,200 T$_s$) in duration. The radio subframe is divided into 10 equal-sized subframes, each subframe being 1 ms long. Each subframe is further divided into two slots, each of 0.5 ms (15,360 T$_s$) duration. T$_s$ represents a sampling time and is given as T$_s$=1/(15 kHz×2048)=3.2552×10$^{-8}$ (about 33 ns). A slot is defined by a plurality of Orthogonal Frequency Division Multiplexing (OFDM) or SC-FDMA symbols in time by a plurality of Resource Blocks (RBs) in frequency. One RB has 12 subcarriers by 7 (6) OFDM or SC-FDMA symbols in the 3GPP LTE system. A unit time for which data is transmitted, known as Transmission Time Interval (TTI) may be defined as one or more subframes. This radio frame structure is purely exemplary and thus the number of subframes, the number of slots, or the number of OFDM/SC-FDMA symbols in a radio frame may vary.

Figure 2:
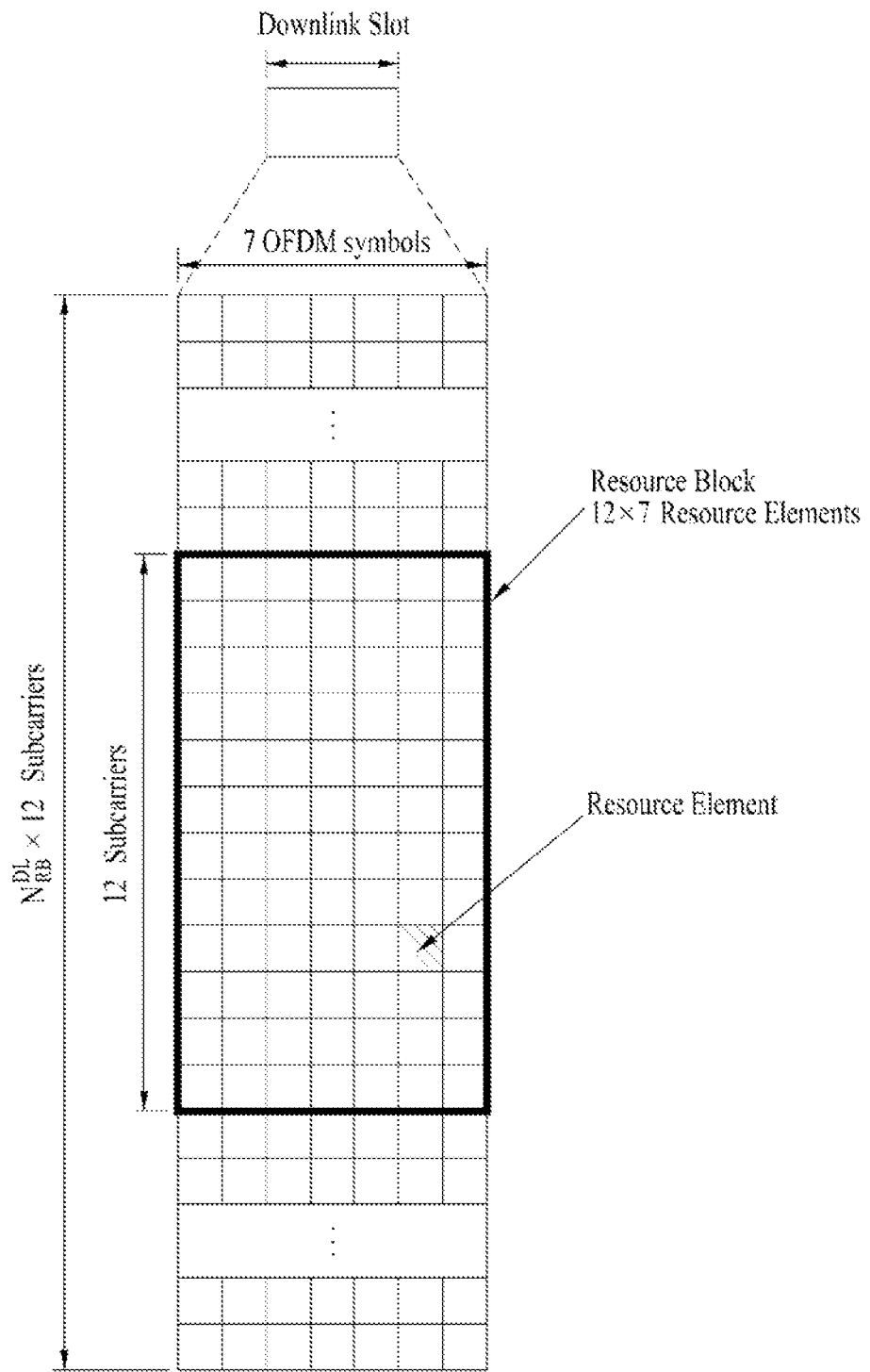
FIG. 2 illustrates the structure of a downlink resource grid for the duration of one downlink slot.

FIG. 2 illustrates the structure of a downlink resource grid for the duration of one downlink slot.

Referring to FIG. 2, a downlink slot includes a plurality of (e.g. 7) OFDM symbols in time by N$^{DL}_{RB}$ RBs in frequency. Because each RB has 12 subcarriers, the downlink slot includes N$^{DL}_{RB}$×12 subcarriers in frequency. In the illustrated case of FIG. 2, the downlink slot has 7 OFDM symbols and each RB includes 12 subcarriers, which does not limit the scope and spirit of the present invention. For example, the number of OFDM symbols per downlink slot depends on the length of a Cyclic Prefix (CP). Each element in the resource grid is referred to as a Resource Element (RE). An RE is a minimum time/frequency resource defined for a physical channel, indicated by one OFDM symbol index and one subcarrier index. Each RB includes N$_{symb}^{DL}$×N$_{sc}^{RB}$ REs where N$_{symb}^{DL}$ represents the number of OFDM symbols per downlink slot and N$_{sc}^{RB}$ represents the number of subcarriers per RB. The number of RBs per downlink slot, N$^{DL}_{RB}$ depends on a downlink transmission bandwidth set by a cell.

The downlink slot structure illustrated in FIG. 2 is adopted for an uplink slot structure, except that SC-FDMA symbols substitute for OFDM symbols in the uplink slot structure.

Figure 3:
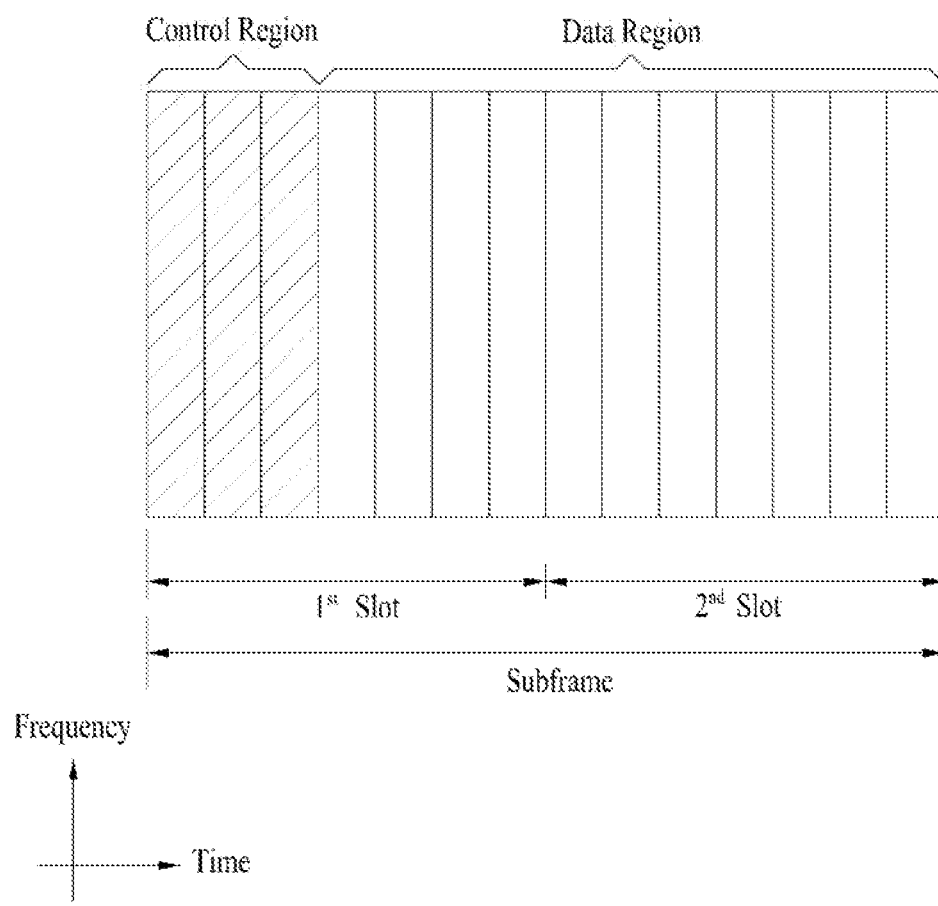
FIG. 3 illustrates a downlink subframe structure.

FIG. 3 illustrates a downlink subframe structure in the 3GPP system.

Referring to FIG. 3, one or more OFDM symbols at the start of a downlink subframe are used for a control region and the other OFDM symbols of the downlink subframe are used for a data region. The size of the control region may be determined independently for each subframe. The control region carries scheduling information and other Layer 1/Layer (L1/L2) control information, whereas the data region carries data. Control channels include a Physical Control Format Indicator CHannel (PCFICH), a Physical Hybrid automatic repeat request (ARQ) Indicator CHannel (PHICH), and a Physical Downlink Control CHannel (PDCCH). Traffic channels include a Physical Downlink Shared CHannel (PDSCH).

The PDCCH delivers information related to resource allocation for transport channels, a Paging CHannel (PCH) and a Downlink Shared CHannel (DL-SCH), an Uplink (UL) scheduling grant, and HARQ information to each UE or each UE group. The PCH and the DL-SCH are delivered on the PDSCH. Therefore, a Base Station (BS) and a User Equipment (UE) transmit and receive data on the PDSCH except for predetermined control information or predetermined service data. Control information carried on the PDCCH is called Downlink Control Information (DCI). The DCI transports uplink resource allocation information, downlink resource allocation information, or uplink transmission power control commands for UE groups. The BS determines a PDCCH format according to DCI directed to a UE and adds a Cyclic Redundancy Check (CRC) to control information. The CRC is masked by a unique Identifier (ID) (e.g. a Radio Network Temporary Identifier (RNTI)) according to the owner or usage of the PDCCH.

Figure 4:
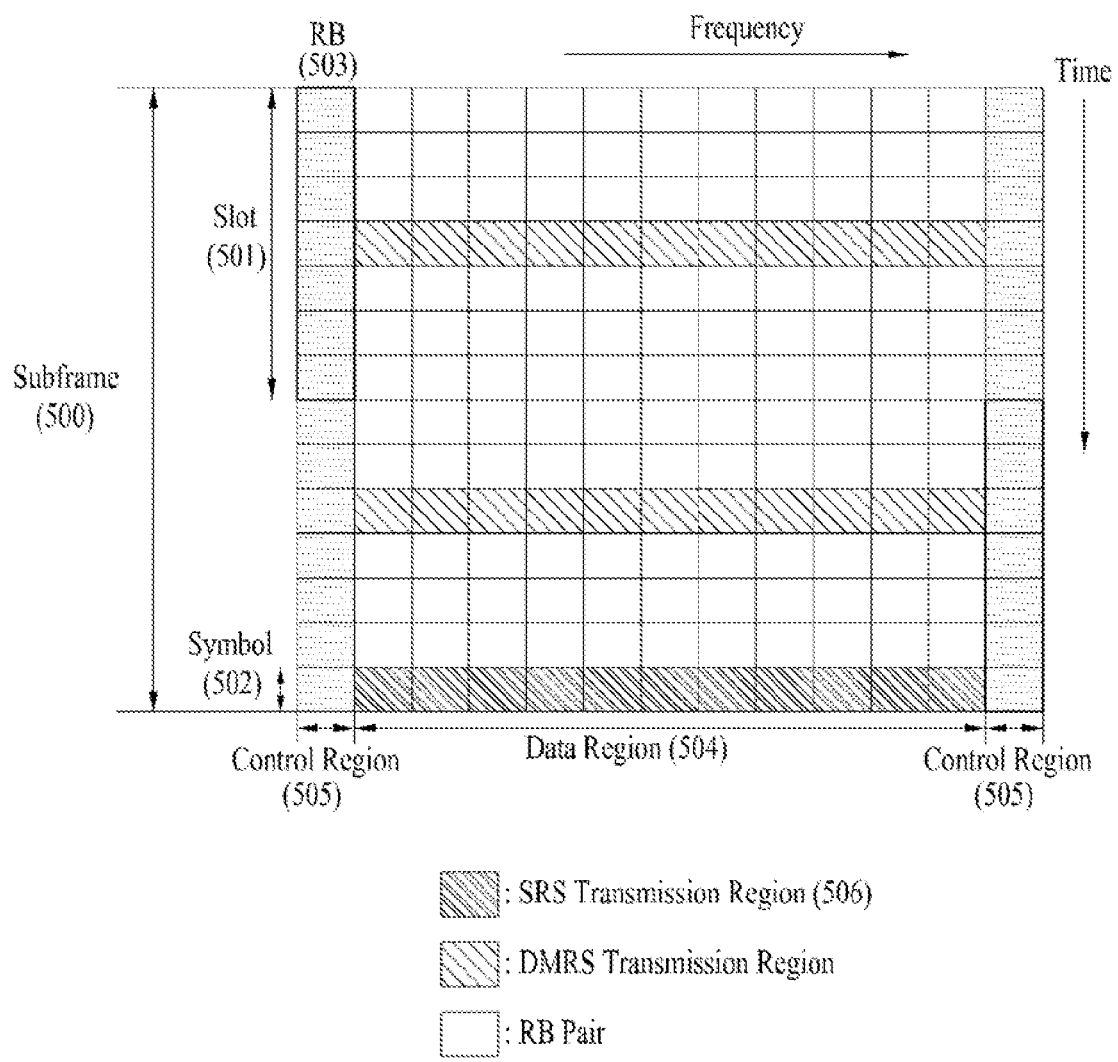
FIG. 4 illustrates an uplink subframe structure in a system.

FIG. 4 illustrates an uplink subframe structure in the 3GPP system.

Referring to FIG. 4, a basic unit for LTE uplink transmission, a 1-ms subframe 500 includes two 0.5-ms slots 501. On the assumption of a normal CP, each slot has 7 symbols 502, each symbol being an SC-FDMA symbol. An RB 503 is a resource allocation unit defined by 12 subcarriers in frequency by one slot in time. The LTE uplink subframe is largely divided into a data region 504 and a control region 505. The data region 504 refers to communication resources used to transmit data such as voice data and packets, including a Physical Uplink Shared CHannel (PUSCH). The control region refers to communication resources used for each UE to transmit a downlink channel quality report, an ACKnowledgment/Negative ACKNowledgment (ACK/NACK) for a received downlink signal, and an uplink scheduling request, including a Physical Uplink Control CHannel (PUCCH). A Sounding Reference Signal (SRS) is transmitted in the last SC-FDMA symbol of a subframe in the time domain. SRSs transmitted in the last SC-FDMA symbol of the same subframe from a plurality of UEs can be distinguished by their frequency positions/sequences.

Now a description will be given of RB mapping. Physical Resource Blocks (PRBs) and Virtual Resource Block (VRBs) are defined. PRBs are configured as illustrated in FIG. 2. Specifically, a PRB is a set of $N_{symb}^{DL}$ contiguous OFDM symbols in time by $N_{sc}^{RB}$ contiguous subcarriers in frequency. PRBs are numbered from 0 to $N_{RB}^{DL}-1$ in the frequency domain. The relationship between PRB numbers $n_{PRB}$ and REs (k,l) in a slot is given by $$n_{PRB} = \left\lfloor \frac{k}{N_{sc}^{RB}} \right\rfloor \quad \text{[Equation 1]}$$

where k denotes a subcarrier index and $N_{sc}^{RB}$ denotes the number of subcarriers in an RB.

A VRB is equal to a PRB in size. Two types of VRBs are defined, Localized VRBs (LVRBs) and Distributed VRBs (DVRBs). Irrespective of the VRB types, a pair of VRBs having the same VRB number $n_{VRB}$ are mapped to two RBs in the two slots of a subframe.

Figure 5:
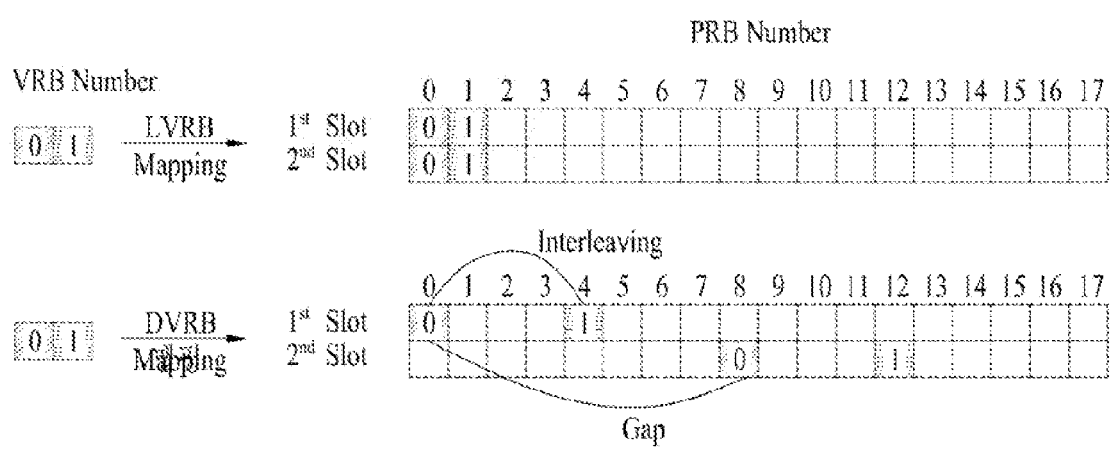
FIG. 5 illustrates a method for mapping Virtual Resource Blocks (VRBs) to Physical Resource Blocks (PRBs)

FIG. 5 illustrates a method for mapping VRBs to PRBs.

Referring to FIG. 5, LVRBs are mapped directly to PRBs such that the numbers of the LVRBs, $n_{VRB}$ is identical to the numbers of the PRBs, $n_{PRB}$ ($n_{VRB}=n_{PRB}$). VRBs are numbered from 0 to $N_{VRB}^{DL}-1$ and $N_{VRB}^{DL}=N_{RB}^{DL}$. In contrast, DVRBs are mapped to PRBs after interleaving. More specifically, a DVRB may be mapped to a PRB as illustrated in [Table 1]. [Table 1] lists RB gaps.

TABLE 1

| System BW ($N_{RB}^{DL}$) | Gap ($N_{gap}$) | |
|---|---|---|
| | 1st Gap ($N_{gap,1}$) | 2nd Gap ($N_{gap,2}$) |
| 5-10 | $\lceil N_{RB}^{DL}/2 \rceil$ | N/A |
| 11 | 4 | N/A |
| 12-19 | 8 | N/A |
| 20-26 | 12 | N/A |
| 27-44 | 18 | N/A |
| 45-49 | 27 | N/A |
| 50-63 | 27 | 9 |
| 64-79 | 32 | 16 |
| 80-110 | 48 | 16 |

$N_{gap}$ denotes the frequency spacing (e.g. in units of a PRB) between PRBs in the first and second slots of a subframe, to which VRBs with the same VRB number are mapped. If $6 \leq N_{RB}^{DL} \leq 49$, only one gap is defined ($N_{gap}=N_{gap,1}$). If $50 \leq N_{RB}^{DL} \leq 110$, two gaps $N_{gap,1}$ and $N_{gap,2}$ are defined. $N_{gap}=N_{gap,1}$ or $N_{gap}=N_{gap,2}$ is signaled through downlink scheduling. DVRBs are numbered from 0 to $N_{VRB}^{DL}-1$. If $N_{gap}=N_{gap,1}$, $N_{VRB}^{DL}=N_{VRB,gap1}^{DL}=2 \cdot \min(N_{gap},N_{RB}^{DL}-N_{gap})$.

If $N_{gap}=N_{gap,2}$, $N_{VRB}^{DL}=N_{VRB,gap2}^{DL}=\lfloor N_{RB}^{DL}/2N_{gap} \rfloor \cdot 2N_{gap}$. min(A, B) represents the smaller value between A and B.

$\tilde{N}_{VRB}^{DL}$ consecutive VRB numbers form a VRB number interleaving unit. If $N_{gap}=N_{gap,1}$, $\tilde{N}_{VRB}^{DL}=N_{VRB}^{DL}$. If $N_{gap}=N_{gap,2}$, $\tilde{N}_{VRB}^{DL}=2N_{gap}$. VRB number interleaving may be performed using four columns and $N_{row}$ rows in each interleaving unit. Thus, $N_{row}=\lceil \tilde{N}_{VRB}^{DL}/(4P) \rceil \cdot P$ where P denotes the size of a Resource Block Group (RBG). An RBG is defined as P consecutive RBs. VRB numbers are written in a matrix row by row and read from the matrix column by column. $N_{null}$ nulls are inserted into the last $N_{null}/2$ rows of the second and fourth columns, and $N_{null}=4N_{row}-\tilde{N}_{VRB}^{DL}$. The nulls are neglected during reading.

Figure 6:
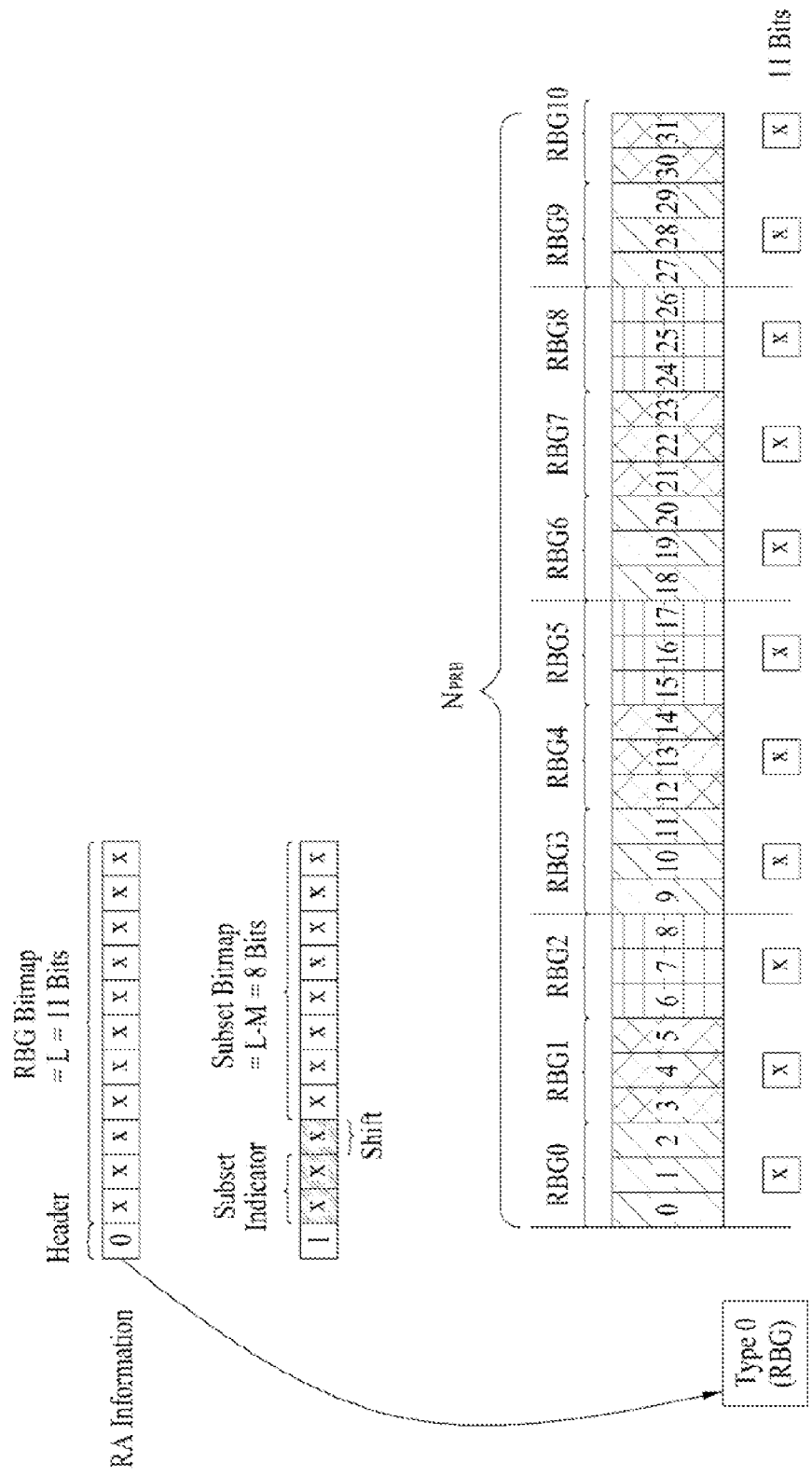
FIGS. 6, 7 and 8 illustrate Resource Allocation (RA) Type 0, RA Type 1, and RA Type 2, respectively.
Figure 7:
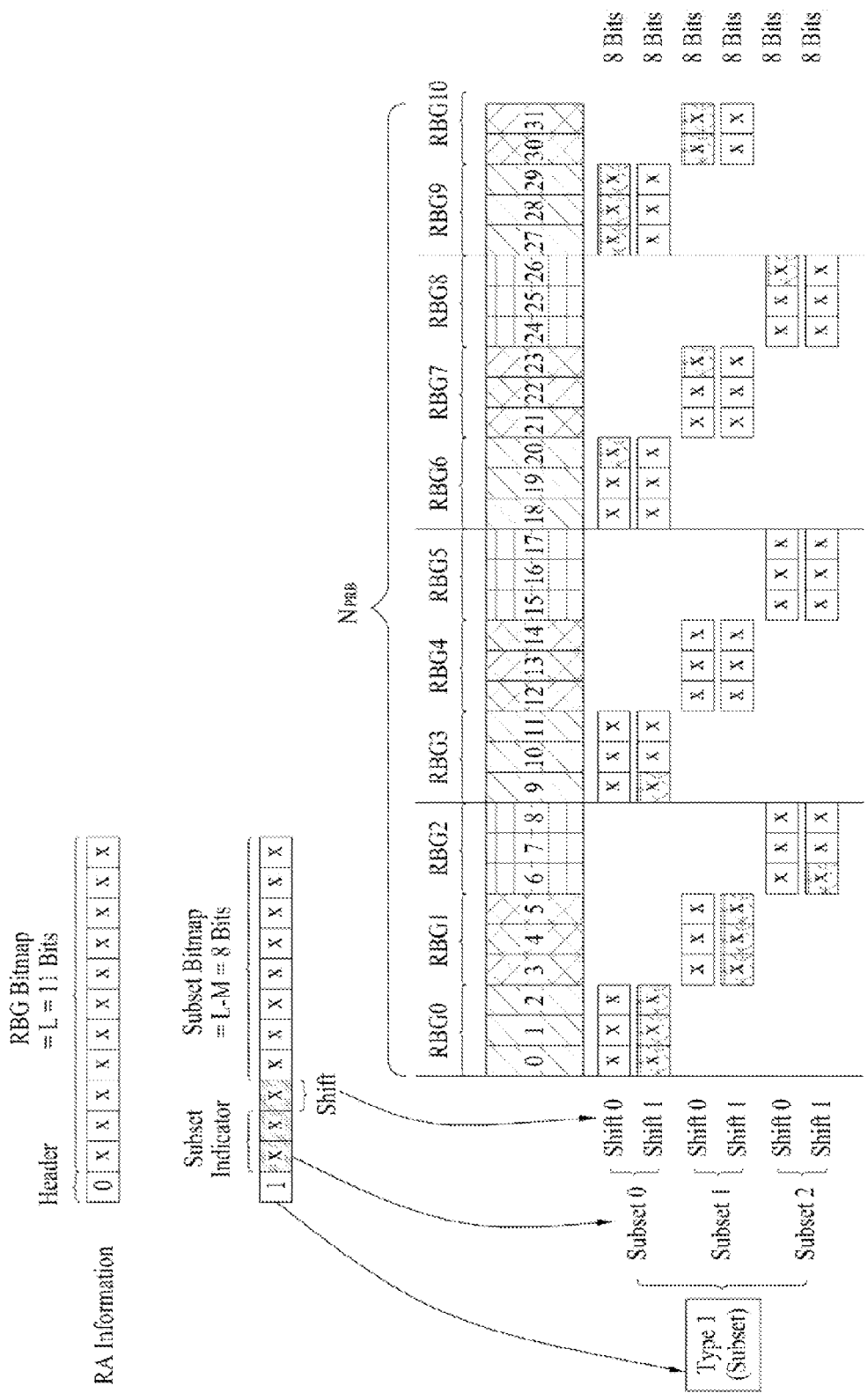
Figure 8:
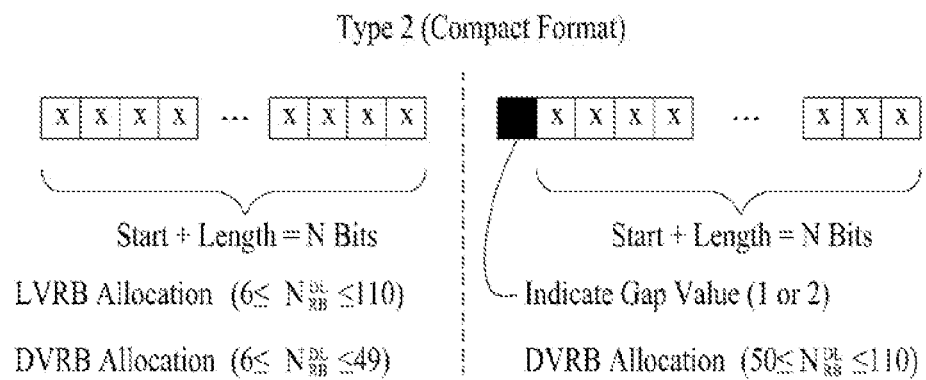

Conventional LTE resource allocations will be described below. FIGS. 6, 7 and 8 illustrate control information formats for Resource Allocation (RA) Type 0, RA Type 1 and RA Type 2 and examples of resource allocation according to the control information formats.

A UE interprets an RA field according to a detected PDCCH DCI format. The RA field of each PDCCH includes two parts, an RA header field and actual RB allocation information. PDCCH DCI formats 1, 2 and 2A are the same in format for RA Type 0 and Type 1 and distinguished from one another by their 1-bit RA header fields according to a downlink system band. Specifically, RA Type 0 and RA Type 1 are indicated by 0 and 1, respectively. While PDCCH DCI formats 1, 2 and 2A are used for RA Type 0 or RA Type 1, PDCCH DCI formats 1A, 1B, 1C, and 1D are used for RA Type 2. A PDCCH DCI format with RA Type 2 does not include an RA header field.

Referring to FIG. 6, in RA Type 0, RB allocation information includes a bitmap indicating RBGs allocated to a scheduled UE. An RBG is a set of consecutive PRBs. The size of an RBG, P depends on a system bandwidth as illustrated in [Table 2] below.

TABLE 2

| System Bandwidth $N_{RB}^{DL}$ | RBG Size (P) |
|---|---|
| ≤10 | 1 |
| 11-26 | 2 |
| 27-63 | 3 |
| 64-110 | 4 |

The total number of RBGs, $N_{RBG}$ for a downlink system bandwidth of $N_{RB}^{DL}$ PRBs is given by $N_{RBG}=\lceil N_{RB}^{DL}/P \rceil$. Each of the $\lfloor N_{RB}^{DL}/P \rfloor$ RBGs is of size P and if $N_{RB}^{DL}$ mod P>0, one of the RBGs has a size of $N_{RB}^{DL}-P \cdot \lfloor N_{RB}^{DL}/P \rfloor$. Herein, mod represents a modulo operation, $\lceil \ \rceil$ represents a ceiling function, and $\lfloor \ \rfloor$ represents a flooring function. The size of the bitmap is $N_{RBG}$ and each bit of the bitmap corresponds to one RBG. The RBGs are indexed from 0 to $N_{RGB}-1$ in an ascending order of frequency. RBG 0 to RBG $N_{RGB}-1$ are sequentially mapped to the Most Significant Bit (MSB) to the Least Significant Bit (LSB) of the bitmap.

Referring to FIG. 7, in RA Type 1, RB allocation information of size $N_{RBG}$ indicates resources of an RBG subset in units of a PRB to a scheduled UE. An RBG subset p ($0 \leq p < P$) includes every $P^{th}$ RBG, starting from RBG p. The RB allocation information has three fields. The first field with $\lceil \log_2(P) \rceil$ bits indicates an RBG subset selected from among P RBG subsets. The second field with one bit indicates a shift of a resource allocation span within the RBG subset. If the bit value is 1, this means that the shift is triggered and if the bit is 0, this means that the shift is not triggered. The third field includes a bitmap in which each bit addresses a single PRB in the selected RBG subset. The part of the bitmap used to address PRBs in the selected RBG subset has size $N_{RB}^{TYPE1}$ and is defined as $$N_{RB}^{TYPE1} = \lceil N_{RB}^{DL}/P \rceil - \lceil \log_2(P) \rceil - 1 \qquad \text{[Equation 2]}$$

The addressable PRB numbers of the selected RBG subset start from an offset, $\Delta_{shift}(p)$ with respect to the smallest PRB number within the selected RBG subset, which is mapped to the MSB of the bitmap. The offset is expressed as the number of PRBs and applied within the selected RBG subset. If the bit value of the second field for shifting a resource allocation span is set to 0, the offset for the RBG subset p is given by $\Delta_{shift}(p) = 0$. Otherwise, the offset for the RBG subset p is given by $\Delta_{shift}(p) = N_{RB}^{RBG\,subset}(p) - N_{RB}^{TYPE1} \cdot N_{RB}^{RBG\,subset}(p)$ is the number of PRBs in the RGB subset p and is computed by $$N_{RB}^{RBG subset}(p) = \begin{cases} \left\lfloor \frac{N_{RB}^{DL}-1}{P^2} \right\rfloor \cdot P + P, & p < \left\lfloor \frac{N_{RB}^{DL}-1}{P} \right\rfloor \bmod P \\ \left\lfloor \frac{N_{RB}^{DL}-1}{P^2} \right\rfloor \cdot P + \\ (N_{RB}^{DL}-1) \bmod P + 1, & p = \left\lfloor \frac{N_{RB}^{DL}-1}{P} \right\rfloor \bmod P \\ \left\lfloor \frac{N_{RB}^{DL}-1}{P^2} \right\rfloor \cdot P, & p > \left\lfloor \frac{N_{RB}^{DL}-1}{P} \right\rfloor \bmod P \end{cases} \qquad \text{[Equation 3]}$$

Referring to FIG. 8, in RA Type 2, RB allocation information indicates a set of contiguous allocated LVRBs or DVRBs to a scheduled UE. In case of RA signaled in PDCCH DCI format 1A, 1B or 1D, a 1-bit flag indicates whether LVRBs or DVRBs are allocated (for instance, if the flag is set to 0, this indicates LVRB allocation and if the flag is set to 1, this indicates DVRB allocation). On the other hand, if RA is signaled in PDCCH DCI format 1C, only DVRBs are always allocated. An RA Type 2 field includes a Resource Indication Value (RIV) corresponding to a starting RB $RB_{start}$ and a length in terms of the number of contiguous allocated VRBs.

Figure 9:
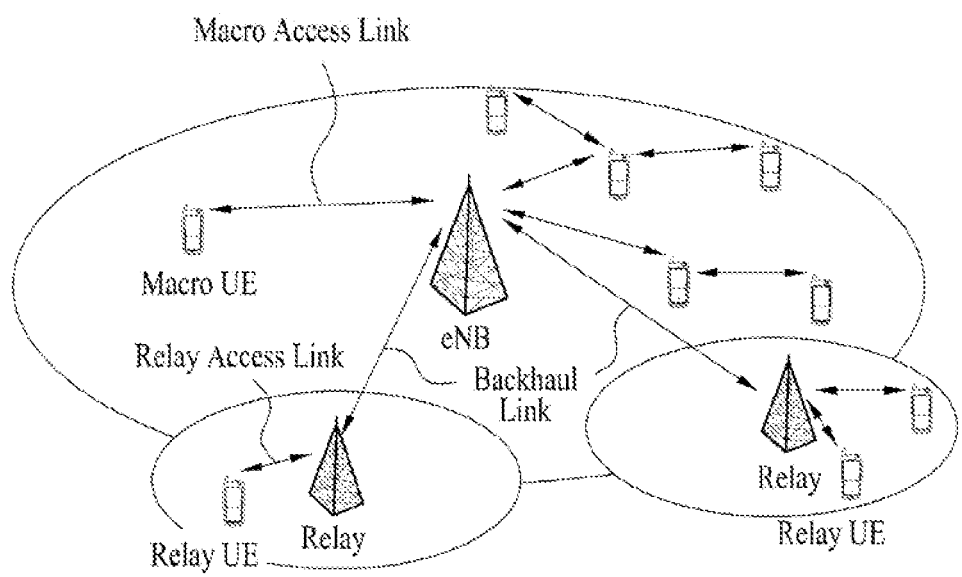
FIG. 9 illustrates a wireless communication system having relays.

FIG. 9 illustrates a communication system having relays or RNs. An RN extends the service area of an eNB or is installed in a shadowing area to thereby provide a reliable service. Referring to FIG. 9, a wireless communication system includes an eNB, RNs, and UEs. The UEs communicate with the eNB or the RNs. For the sake of convenience, a UE communicating with an eNB is referred to as a macro UE and a UE communicating with an RN is referred to as a relay UE. A communication link between an eNB and a macro UE and a communication link between an RN and a relay UE are referred to as a macro access link and a relay access link, respectively. A communication link between an eNB and an RN is referred to as a backhaul link.

RNs are classified into L1 RNs, L2 RNs, and L3 RNs according to their functionalities in multi-hop transmission. An L1 RN usually functions as a repeater. Thus, the L1 RN simply amplifies a signal received from a BS or a UE and transmits the amplified signal to the UE or the BS. Because the L1 RN does not decode a received signal, the transmission delay of the signal is short. Despite this benefit, noise is also amplified because the L1 RN does not separate the signal from the noise. To avert this problem, an advanced repeater or smart repeater capable of UL power control or self-interference cancellation may be used. The operation of an L2 RN may be depicted as decode-and-forward. The L2 RN can transmit user-plane traffic to L2. While the L2 RN does not amplify noise, decoding increases transmission delay. An L3 RN whose operation is depicted as self-backhauling can transmit an Internet Protocol (IP) packet to L3. As it is equipped with a Radio Resource Control (RRC) function, the L3 RN serves as a small-size eNB.

L1 and L2 RNs may be regarded as part of a donor cell covered by an eNB. In the case where an RN is a part of a donor cell, the RN does not have its own cell ID because it cannot control its cell and UEs of the cell. Nonetheless, the RN may still have a relay ID. At least part of Radio Resource Management (RRM) is controlled by the eNB to which the donor cell belongs, while part of the RRM may be located in the RN. An L3 RN can control its own cell. Then the L3 RN may manage one or more cells and each of the cells may have a unique physical-layer cell ID. The L3 RN may have the same RRM mechanism as an eNB. From the perspective of a UE, there is no difference between accessing a cell controlled by the L3 RN and accessing a cell controlled by a normal eNB.

RNs may be classified as follows according to mobility.
Fixed RN: as is implied from its appellation, this type RN is permanently fixed for use in a shadowing area or for coverage extension. It may function as a simple repeater.
Nomadic RN: this type RN is temporarily installed when users are rapidly increasing in number, or is movable within a building.
Mobile RN: this RN can be installed in a public transportation vehicle such as a bus or the subway. The mobility of the RN should be supported.

The following classifications can also be considered according to the links between RNs and networks.
In-band connection: a network-to-relay link shares the same frequency band with a network-to-UE link in a donor cell.
Out-band connection: a network-to-relay link and a network-to-UE link use different frequency bands in a donor cell.

Depending on a UE is aware of the existence of an RN, RNs are classified into the followings.
Transparent RN: a UE is not aware of whether or not it is communicating with a network via the RN.
Non-transparent RN: a UE is aware of whether or not it is communicating with a network via the RN.

Figure 10:
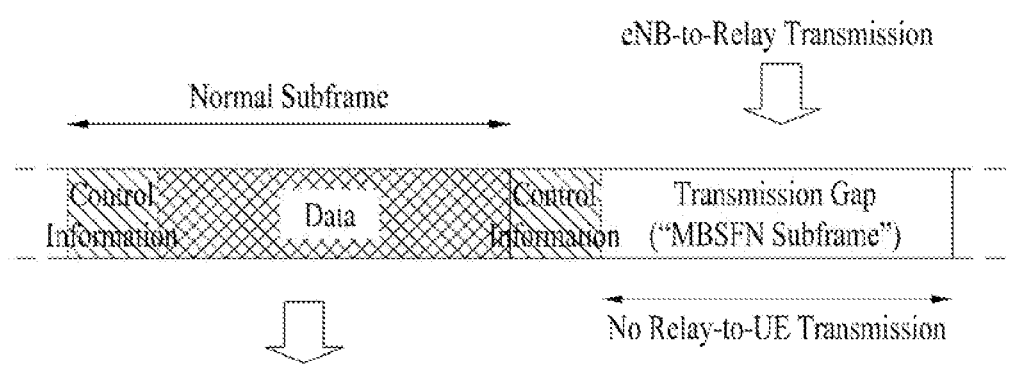
FIG. 10 illustrates backhaul communication in a Multi-Media Broadcast over a Single Frequency Network (MBSFN) subframe.

FIG. 10 illustrates an example of backhaul transmission in a Multi-Media Broadcast over a Single Frequency Network (MBSFN) subframe. For in-band relaying, an eNB-to-RN link (i.e. a backhaul link) operates in the same frequency band as an RN-to-UE link (i.e. a relay access link). In the case where an RN transmits a signal to a UE while it is receiving a signal from an eNB or vice versa, the transmitter and receiver of the RN interfere mutually. Accordingly, simultaneous eNB-to-RN and RN-to-UE transmissions in the same frequency resources may be limited. For this purpose, the backhaul link and the relay access link are partitioned in Time Division Multiplexing (TDM). In the LTE-A system, a backhaul link is established in an MBSFN subframe to support measurements of legacy LTE UEs located in a relay zone (fake MBSFN). If a subframe is signaled as an MBSFN subframe, a UE receives only the control region (ctrl) of the subframe and thus the RN may configure a backhaul link using the data region of the subframe. Specifically, the MBSFN subframe is used for eNB-to-RN transmission (e.g. a Relay-PDCCH (R-PDCCH) and a Relay-PDSCH (R-PDSCH)), starting from the third OFDMA symbol of the MBSFN subframe.

Embodiment 1

Figure 11:
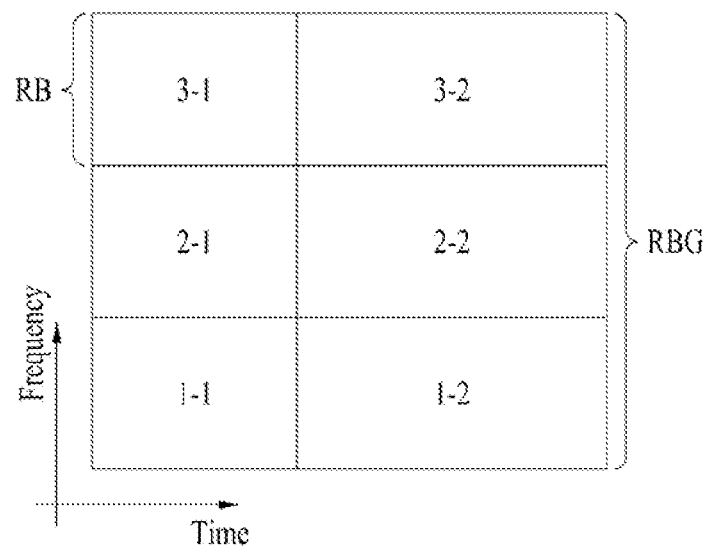
FIG. 11 illustrates arbitrary time-frequency resource partitioning.

FIG. 11 illustrates arbitrary time-frequency resource partitioning. The time-frequency resources illustrated in FIG. 11 may be a part of a downlink subframe.

In FIG. 11, time-frequency resource regions labeled by X-Y may be configured in various sizes. For example, each resource region X-1 (X=1, 2 and 3) may be defined as 4 OFDM symbols in time by 12 subcarriers in frequency. Each resource region X-2 (X=1, 2 and 3) may be defined as 7 OFDM symbols in time by 12 subcarriers in frequency. The number of symbols may vary with CP lengths. The above-mentioned numbers of symbols and subcarriers may be changed. In other words, resource regions X-1 may be a part of a first slot and resource regions X-2 may be a part of a second slot. This resource configuration is typical to a backhaul subframe between an eNB and an RN. In this case, the structure illustrated in FIG. 11 corresponds to the remaining part of the MBSFN subframe except the control region illustrated in FIG. 10.

FIG. 11 illustrates RBs and an RBG to indicate resource sizes in the frequency domain. As illustrated in FIG. 2, an RB is resources defined on a slot basis. Therefore, each resource region X-Y corresponds to one RB and resource regions [X-1, X-2] correspond to an RB pair. Unless otherwise specified, an RB means a resource region [X-1] or [X-2], or RN regions [X-1, X-2] in the context. While three RBs form an RBG in FIG. 11, this is purely exemplary. The number of RBs per RBG may vary according to system bands as illustrated in [Table 2]. Herein, an RB refers to a PRB or a VRB.

Now a description will be given of methods for allocating and transmitting control information and data in the resource configuration illustrated in FIG. 11. Preferably, control information (e.g. an R-PDCCH) used for an eNB-RN link is transmitted in a predetermined resource region. According to an example of the present invention, when LTE RA Type 0 is adopted, the predetermined resource region carrying control information (referred to as an R-PDCCH search space) may be limited to a $K^{th}$ RB of an allocated RBG or RBGs. K is an integer smaller than the number of RBs in an RBG. That is, it is possible that the $K^{th}$ RB of every allocated RBG carries an R-PDCCH. K may be the first or last RB of an RBG. In case of LTE RA Type 1, a specific RB may be indicated to carry the control information. For example, resource region 1-1 illustrated in FIG. 11 may be reserved as an R-PDCCH search space.

R-PDCCH/(R-)PDSCH Allocation and Demodulation

Control information is transmitted on an R-PDCCH and data is transmitted on an (R-)PDSCH. R-PDCCHs are divided into two categories. One category is a DL grant (DG) and the other category is a UL grant (UG). The DL grant contains information about time/frequency/space resources of an R-PDSCH corresponding to data to be received at an RN and information needed to decode the R-PDSCH. The UL grant contains information about time/frequency/space resources of an R-PUSCH corresponding to data to be transmitted from an RN and information needed to decode the R-PUSCH. With reference to the attached drawings, methods for allocating DL/UL grants to resource regions of a backhaul subframe and demodulating the DL/UL grants will be described below.

Figure 12:
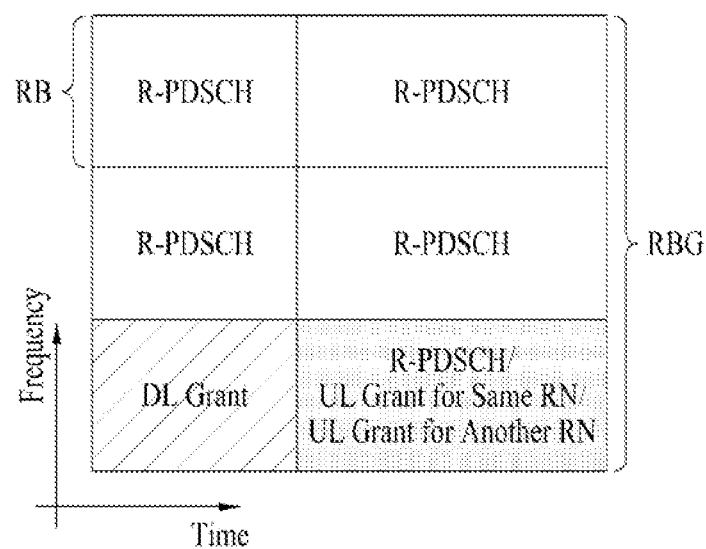
FIGS. 12, 13 and 14 illustrate examples of allocating and demodulating Relay-Physical Downlink Control CHannels (R-PDCCHs)/(Relay-)Physical Downlink Shared CHannels ((R-) PDSCHs) according to an embodiment of the present invention.

FIG. 12 illustrates an example of allocating and demodulating R-PDCCHs/(R-)PDSCHs. It is assumed here that (R-)PDSCH resources are allocated in LTE RA Type 0 (allocation on an RBG basis). However, this is purely exemplary and this example is performed in the same manner/similarly in case of LTE RA Type 1 (allocation on an RB basis). While an RBG including a DL grant is allocated to an RN in the illustrated case of FIG. 11, this is exemplary. Thus, the RBG including a DL grant may not be allocated to the RN.

In FIG. 12, in the presence of a DL grant for RN#1 in resource region 1-1, (a) data (an (R-)PDSCH), (b) a UL grant for RN#1, or (c) a UL grant for another RN exists in resource region 1-2.

The existence of information (a), (b) or (c) in resource region 1-2 may be known from RA information (e.g. RBG or RB allocation information). For instance, if the RBG is all allocated to RN#1, RN#1 may determine whether information (a) or (b) is included in resource region 1-2 by interpreting RA information of the DL grant. Specifically, if resource region X-1 contains an RB or RBG in which a first R-PDCCH (e.g. a DL grant) directed to RN#1 is detected, RN#1 may assume that data for RN#1 exists in resources other than the resources of the first R-PDCCH in the corresponding RB or RBG. Accordingly, if the RA information indicates the existence of data in the corresponding RB or RBG, RN#1 may determine that R-PDCCHs other than the detected DL grant are not present in the corresponding RB or RBG. That is, RN#1 may determine that resource region 1-2 contains information (a). On the other hand, if the RA information indicates the absence of data in the corresponding RB or RBG, RN#1 may detect an appropriate data starting point (e.g. resource region 2-1), determining that a second R-PDCCH like information (b) or (c) exists. An eNB and the RN may assume that the size of the second R-PDCCH is unchanged. In case of information (c), RN#1 may determine that the second R-PDCCH is not a UL grant for RN#1 by attempting a CRC check using an RN ID. Meanwhile, even though RA information is used to identify information (a), (b) or (c), it may be implicitly set beforehand that an RBG carrying a DL grant is resources allocated to data for RN#1.

While a DL grant is shown in FIG. 12 as occupying a whole resource region X-1 (e.g. resource region 1-1), this is purely exemplary. Thus, it is clear that the above-described method can be applied in the same manner when the DL grant exists in a part of resource region 1-1. In addition, while the DL grant is located in a resource region X-1 in FIG. 12, a UL grant may reside in a resource region X-1. In this case, the RN decodes the UL grant earlier than the DL grant. While the second R-PDCCH is shown as a UL grant in FIG. 12, it may be a DL grant.

Figure 13:
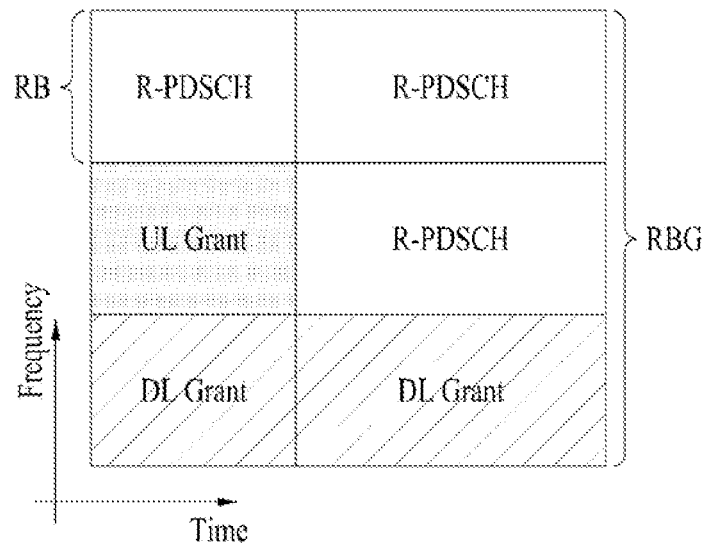
Figure 14:
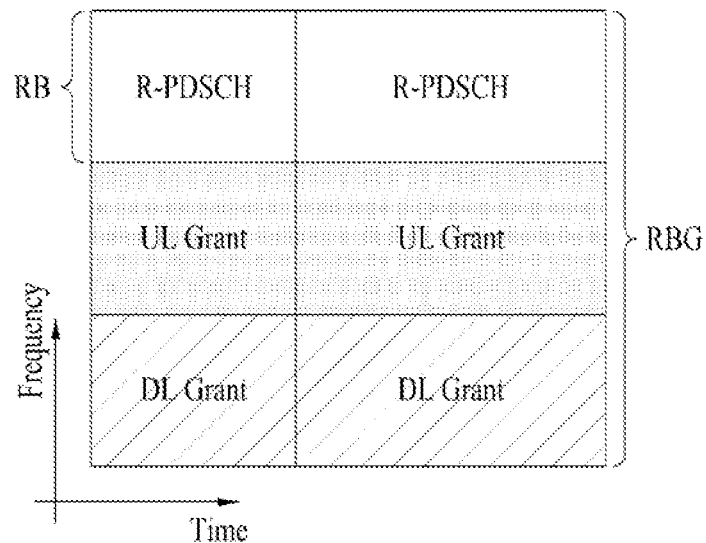

FIGS. 13 and 14 illustrate other examples of allocating and demodulating R-PDCCHs/(R-)PDSCHs. The examples are based on the assumption that (R-)PDSCH resources are allocated in LTE RA Type 0 (allocation based on an RBG basis). However, the same description is applicable in the same manner or a similar manner to the case of LTE RA Type 1 (allocation on an RB basis). In addition, while an RBG carrying a DL grant is allocated to a corresponding RN in FIG. 12, it is also possible that the RBG carrying a DL grant is not allocated to the corresponding RN.

Referring to FIGS. 13 and 14, when a DL grant for RN#1 exists in resource regions 1-1 and 1-2, (a) data (an (R-)PDSCH) exists in resource regions 2-1 and 2-2 (not shown), (b) a UL grant for RN#1 exists in resource region 2-1 (FIG. 13), or (c) a UL grant for RN#1 exists in resource regions 2-1 and 2-2 (FIG. 14).

RN#1 may identify (a), (b) or (c) by blind decoding. It is preferred that data or control information for RN#1 is located in a resource region 2-X.

Additionally, RN#1 may identify (a), (b) or (c) using RA information (e.g. an RBG allocation bit) of the DL grant. For example, RN#1 may determine from the RA information whether resource region 2-1 carries data for RN#1 or a UL grant confined to resource region 2-1 (i.e. (a) or (b)) (Case A).

RN#1 may also determine from the RA information whether resource regions 2-1 and 2-2 carry data for RN#1 or a UL grant confined to resource regions 2-1 and 2-2 (i.e. (a) or (c)) (Case B). To enable the RN to identify a UL grant or data in the resource regions, the eNB should set an eNB-RN operation on the premise of Case A or Case B. That is, RN#1 may distinguish (a) from (b) or (c) using the RA information (e.g. the RBG allocation bit). The case for which the RBG allocation bit is to be used should be preset. For example, it should be preliminarily preset that a UL grant is confined to resource region 2-1 or resource regions 2-1 and 2-2.

In the presence of a DL grant for RN#1 in resource regions 1-1 and 1-2, (a) data for RN#1 exists in resource regions 2-1 and 2-2 (not shown), (b) a DL or UL grant for another RN exists in resource region 2-1 (FIG. 13), or (c) a DL or UL grant for another RN exists in resource regions 2-1 and 2-2 (FIG. 14). In this case, (a) may be distinguished from (b) or (c) using an RBG allocation bit. Accordingly, the case for which the RGB allocation bit is to be used should be preset.

On the assumption that there are only DL/UL grant sizes equal to a DL grant size in the above methods, the RBG allocation bit may indicate whether data or control information exists in resource region 2-1 or resource regions 2-1 and 2-2 and the size of a DL/UL grant (i.e. resource region 2-1 or resource regions 2-1 and 2-2) may be determined according to the size of the detected DL grant.

The above methods are applicable in the same manner to the case where a DL grant is located across resource regions 1-1, 1-2, and 1-3. In addition, the above methods are applicable in the same manner to the case where a UL grant is wholly or partially located across resource regions 1-1, 1-2, and 1-3. In this case, the RN blind-decodes a UL grant earlier than a DL grant in the above methods.

R-PDCCH Mapping and Detection at High Aggregation Level

Figure 15:
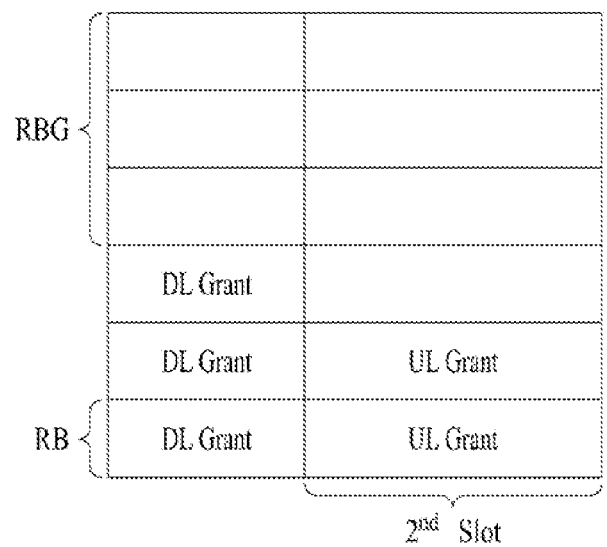
FIG. 15 illustrates an example of allocating Downlink (DL) grants and Uplink (UL) grants.

The Relay-Control Channel Element (R-CCE) aggregation level (e.g. 1, 2, 4, 8, . . . ) of an R-PDCCH may change according to a channel environment, like the CCE set of an LTE PDCCH. Lets' assume that a DL grant of an R-PDCCH exists across three RBs and a UL grant is transmitted in the second slot of two RB pairs as illustrated in FIG. 15. When an RN finds out R-CCE aggregation illustrated in FIG. 15 by blind decoding of the DL grant, the RN does not know whether a UL grant or data exists in the second slot.

The afore-described methods may be performed in a similar manner. That is, the existence or absence of a UL grant in the second slot may be indicated by an RBG allocation bit. Preferably, it may be assumed that an RBG having a DL grant is allocated to a corresponding RN. Accordingly, if a DL grant is located in the first slot, the RA bit of the corresponding RBG may indicate whether an R-PDSCH or a UL grant exists in the second slot. The following cases are possible.

(a) An R-PDSCH exists in the second slot; or
(b) A UL grant for the same RN or another RN exists in the second slot. The UL grant for another RN may be identified by an RN ID-based CRC check.

The problem is to determine an RB pair or RB pairs carrying the UL grant. For instance, the number of RB pairs carrying the UL grant may vary according to an R-CCE aggregation level.

The number/positions of RB pairs carrying the UL grant may be determined by establishing a simple relationship between DL grant sizes and UL grant sizes. This will be described with reference to FIGS. 16 and 17.

Figure 16:
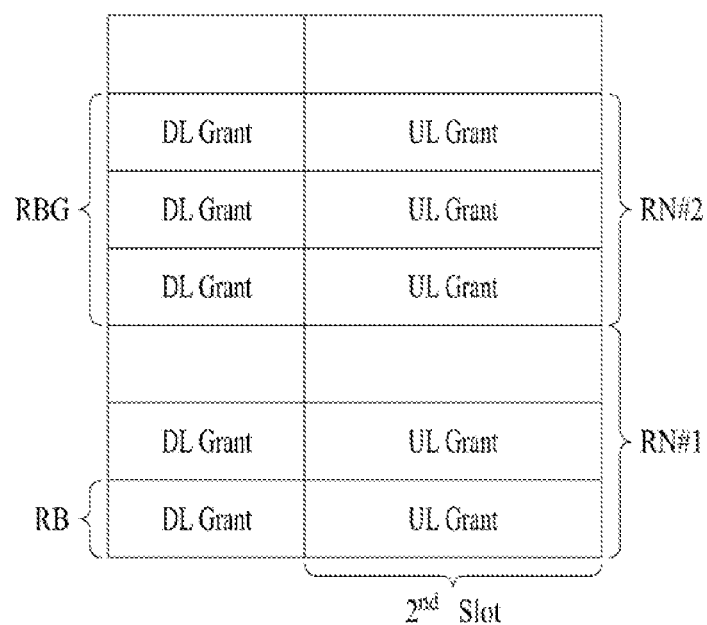
FIGS. 16 and 17 illustrate examples of allocating DL grants and UL grants according to another embodiment of the present invention.

Referring to FIG. 16, it may be regulated that a UL grant should always exist in an RB pair carrying a DL grant. Therefore, if the DL grant occupies two RB pairs, the UL grant may also exist in the two RB pairs. When the RN succeeds in detecting the DL grant, the RN may locate the UL grant. For this operation, a UL grant aggregation level may be set to be larger than a DL grant aggregation level. Or a difference of an N_level multiple may be preset between the DL grant aggregation level and the UL grant aggregation level.

In an implementation example, it may be regulated that one R-CCE should exist in the first slot of an RB pair and two R-CCEs should exist in the second slot of the RB pair.

In this case, the first and second slots differ in R-CCE size. According to the implementation example, the DL grant aggregation level×2 may be preset to a UL grant aggregation level. Referring to FIG. 16, the DL and UL grant aggregation levels are 2 and 4, respectively for RN#1 and 3 and 6, respectively for RN#2.

In another example, an R-CCE size may be defined on a slot basis. That is, each of the first and second slots of an RB pair may have one R-CCE. In this case, the R-CCEs of the first and second slots have different sizes. According to the example, the DL and UL grant aggregation levels may be preset to the same value. In FIG. 16, the DL and UL grant aggregation levels is 2 for RN#1 and 3 for RN#2.

Figure 17:
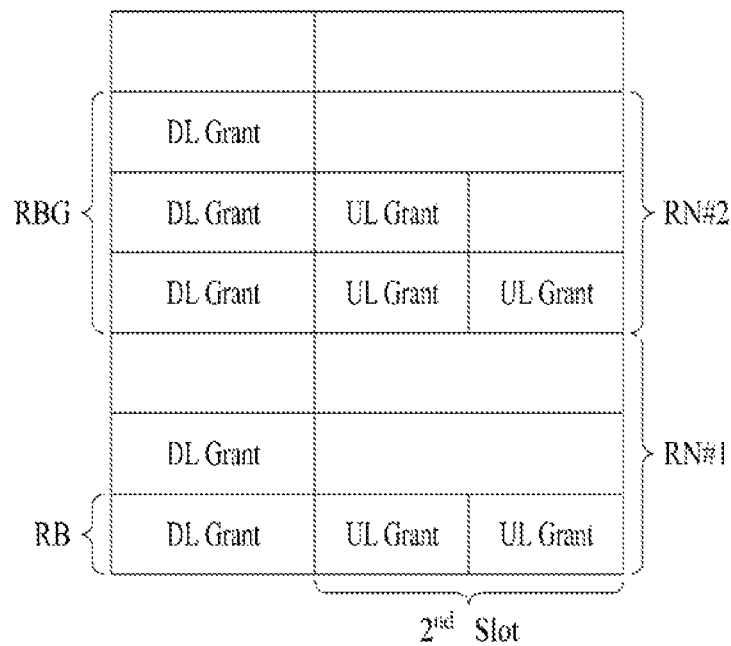
Figure 17:
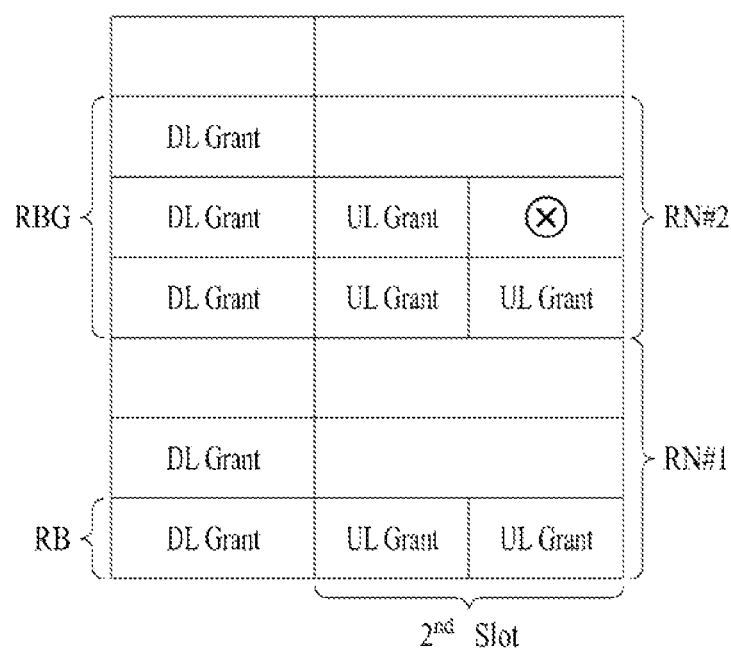

Referring to FIG. 17, one R-CCE size is given and the DL and UL grant aggregation levels are equal, by way of example. For example, the R-CCE size may be 32 REs. Since the second slot has a larger resource area than the first slot, DL and UL grants may be allocated in the manner illustrated in FIG. 17. For RN#2, only a part of the second slot of the second RB pair is used for UL grant transmission. In this case, the empty space of the second slot may or may not be used for data transmission (FIG. 17(*a*) or FIG. 17(*b*)).

In another method, the number of RBs occupied by a UL grant may be limited. For example, transmission of a UL grant may be confined to the second slot of one RB pair as is done for RN#1 in FIG. 17. The constraint may be specified in a standard or the eNB may signal the constraint to the RN by higher-layer signaling. If this constraint is imposed, the RN may readily determine an area occupied by a UL grant by reinterpreting the afore-described RA information and thus may locate a data signal.

Reinterpretation of an RBG allocation bit for the purpose of distinguishing a UL grant from data (an R-PDSCH) in the above description is possible on the assumption that a corresponding RBG is used only for a corresponding RN. However, if an RBG is to be used in the original meaning of its value, additional signaling is possible. The signaling may be transmitted on an R-PDCCH. Whether to use the additional signaling or reinterpret an RBG may be preset or signaled semi-statically.

If the RN fails to decode a UL grant even though the existence of the UL grant is indicated in the above methods, data (including the UL grant) existing in the corresponding slot may be combined with HARQ retransmission data. In this case, since the UL grant may cause a serious error to the HARQ-combined data, previous data that is likely to include a UL grant may be excluded from HARQ combining.

Embodiment 2

Figure 18:
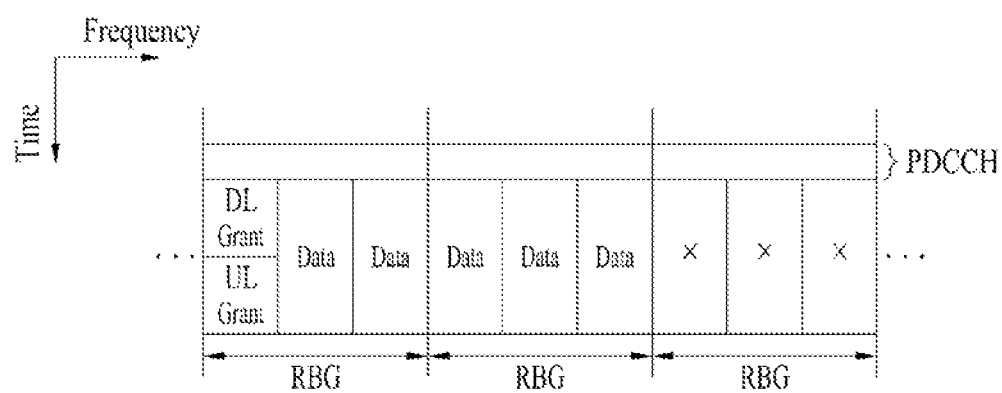
FIG. 18 illustrates an example of transmitting a downlink signal to a Relay Node (RN)

FIG. 18 illustrates an example of transmitting a downlink signal to an RN. The downlink signal for the RN includes control information and data. The control information is transmitted on an R-PDCCH and the data is transmitted on an (R-)PDSCH. R-PDCCHs are categorized into a DL grant and a UL grant. The DL grant contains information about time/frequency/space resources of an R-PDSCH corresponding to data to be received at an RN and information needed to decode the R-PDSCH. The UL grant contains information about time/frequency/space resources of an R-PUSCH corresponding to data to be transmitted from an RN and information needed to decode the R-PUSCH.

It is assumed in the example that a DL grant is transmitted in a starting part of an RB or RBG. When the eNB transmits DL and UL grants simultaneously in time to a specific RN, it is assumed that the UL grant shortly follows the DL grant in time. The DL grant may be delivered in the first slot of an RB or RBG and the UL grant may be delivered in the second slot of the RB or RBG. The data (the (R-) PDSCH) and the R-PDCCH are multiplexed in FDM, TDM, or a combination of both.

The RN monitors a specific area in which an R-PDCCH may be transmitted (an R-PDCCH search space) in order to detect the R-PDCCH. An R-PDCCH for a DL grant (DG) and an R-PDCCH for a UL grant (UG) are set independently for the RN. Accordingly, the RN blind-decodes the R-PDCCH search space for a DL grant (hereinafter, referred to as a DL SS) to detect the DL grant and blind-decodes the R-PDCCH search space for a UL grant (hereinafter, referred to as a UL SS) to detect the UL grant. Since the RN should attempt blind decoding in different R-PDCCH search spaces to detect the DL grant and the UL grant, blind decoding complexity may be increased.

With reference to FIGS. 19 to 24, various methods for reducing the blind decoding complexity of an RN will be described below.

Figure 19:
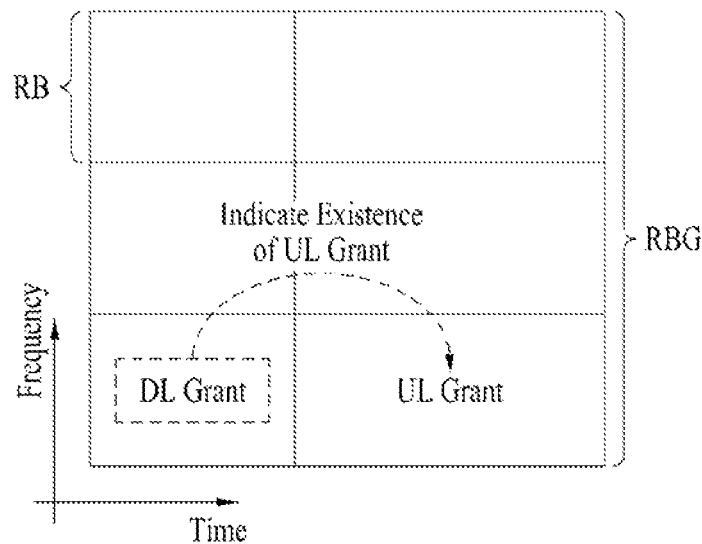
FIGS. 19 to 24 illustrate methods for reducing blind decoding complexity of an RN according to another embodiment of the present invention.

Referring to FIG. 19, a DL grant may indicate to an RN whether a UL grant is transmitted to the RN. In the embodiment of the present invention, since the RN has only to detect the DL grant, there is no need for detecting both the DL and UL grants by blind decoding. As a result, the blind decoding complexity of the RN is decreased. In FIG. 19, the DL grant and the UL grant are transmitted in the first and second slots of the same RB pair, by way of example. When the position relationship between the DL and UL grants is fixed in this manner, it is sufficient that the DL grant indicates whether the UL grant is transmitted or not. Signaling of a DL grant to indicate whether a UL grant is transmitted or not may be implemented in various manners. For example, transmission or non-transmission of a UL grant may be indicated by 1-bit information (e.g. 0 or 1) of a DL grant. Or transmission or non-transmission of a UL grant may be indicated by 1-bit code point state information in a DL grant. Or transmission of a DL grant itself may indicate transmission of a UL grant. Or transmission or non-transmission of a UL grant may be indicated by a masking code or scrambling sequence applied to a DL grant. Meanwhile, both the DL and UL grants may not be located in the same RB pair, compared to the case illustrated in FIG. 19. That is, the DL grant and the UL grant may be located in different RB pairs. In this case, the DL grant may include information indicating the transmission position of the UL grant. The information indicating the transmission position of the UL grant may also be used to indicate whether the UL grant is transmitted or not.

Figure 20:
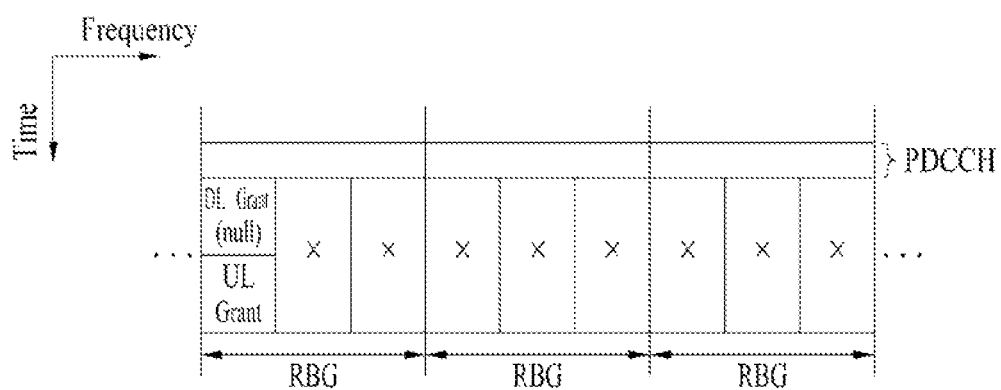

Referring to FIG. 20, even though the eNB does not have downlink data (e.g. an (R-)PDSCH) to be transmitted to an RN (i.e. a UL grant-only case), the eNB may transmit a null DL grant (or a dummy DL grant) to the RN to indicate whether a UL grant is transmitted or not. In this example, since blind decoding for detecting a UL grant can be omitted irrespective of the presence or absence of downlink data for the RN, the blind decoding complexity of the RN is reduced. In the situation where no downlink data actually exists for the RN despite transmission of both the DL and UL to the RN, it should be indicated that there is no data corresponding to the DL grant (i.e. the null DL grant). For this purpose, the null DL grant may indicate that every downlink Transport Block (TB) or codeword has been disabled. Or the null DL grant may indicate TBS=0 or TBS<K (e.g. 4 RBs) where TBS stands for a Transport Block Size. Or the null DL grant may indicate that no RB has been allocated for downlink transmission. Or a specific field of the null DL grant may be set to all '0s' or '1s'. Upon detection of the null DL grant, the RN may determine transmission or non-transmission/position of the UL grant from the null DL grant, interpreting that there is no data transmission corresponding to the null DL grant.

Figure 21:
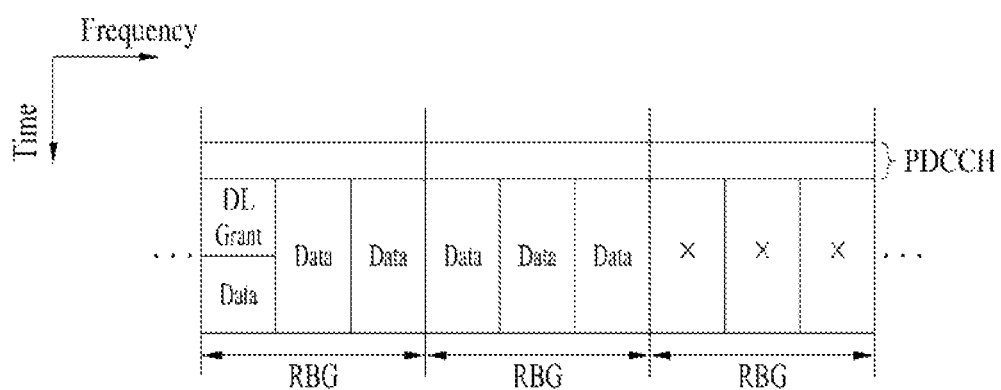

Referring to FIG. 21, in the case where a DL grant indicates no UL grant transmission and data is allocated to resources available to a UL grant, an RN may utilize the corresponding resources during (R-)PDSCH decoding. On the other hand, if the presence or absence of a UL grant is determined only by bind decoding and the RN fails to accurately detect the UL grant, the RN may not determine accurately whether the corresponding resources have been used for UL grant transmission or data transmission.

Figure 22:
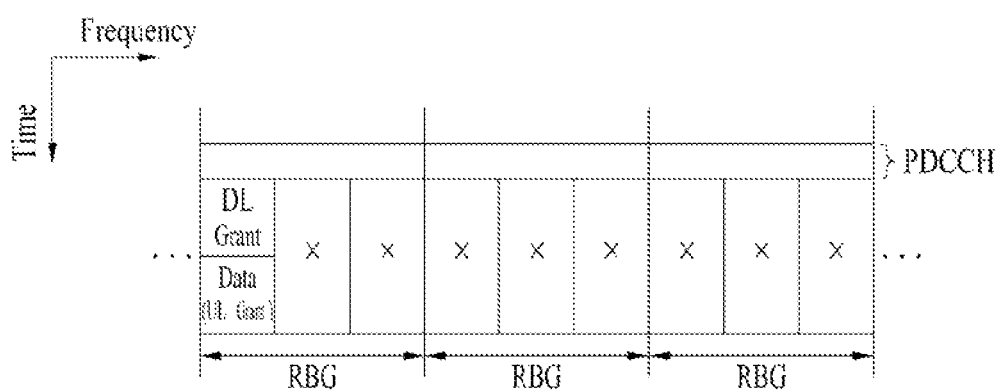

Referring to FIG. 22, a DL grant does not indicate whether a UL grant is transmitted or not. Instead, the DL grant indicates the presence of data in a resource region available to a UL grant and the UL grant is transmitted in the form of data (i.e. an (R-)PDSCH). In this case, downlink data (i.e. DL SCH data) may not be scheduled, for the UL grant transmission. In another example, a UL grant and downlink data (e.g. DL SCH data) may be multiplexed and thus transmitted together. In this example, since a DA does not need to signal transmission or non-transmission of a UL grant and the UL grant is handled as data, blind decoding complexity does not further increase.

Figure 23:
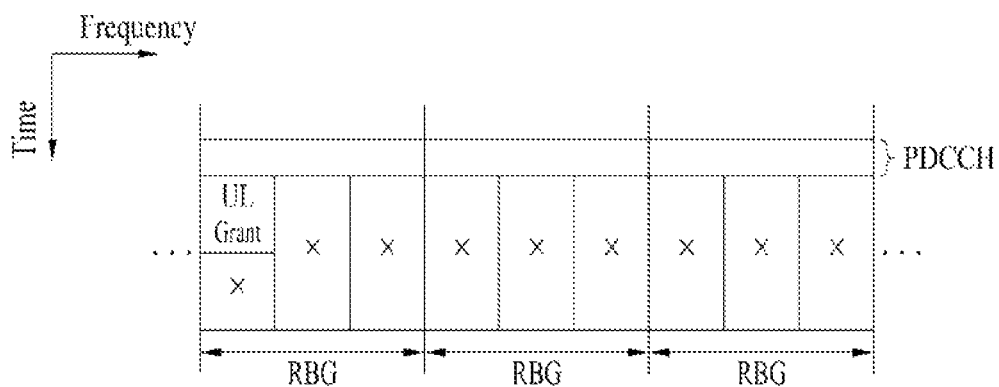
Figure 24:
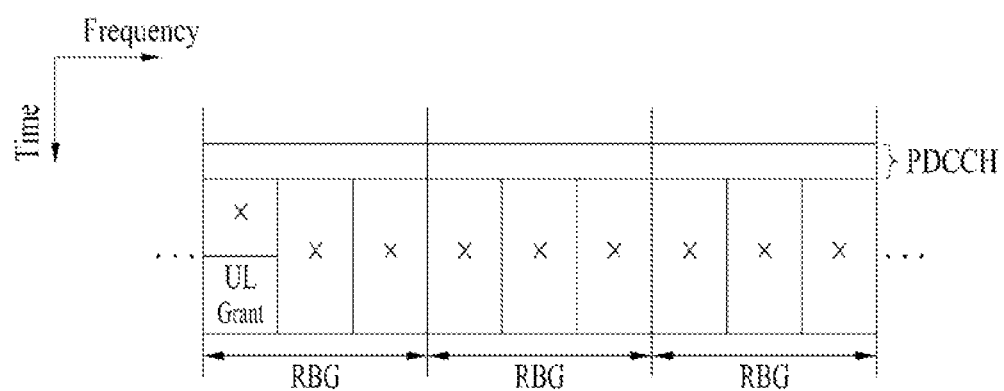

Referring to FIGS. 23 and 24, a UL grant may be transmitted in resources available to a DL grant. If a DL grant is transmitted, the UL grant may be transmitted in resources available to a UL grant. That is, an RN may blind-decode two resource regions for the UL grant. In the example, although the number of blind decodings for a UL grant is increased, the increase of resources available to the UL grant in turn increases the scheduling flexibility of the eNB. Especially, an opportunity for intensive transmission of UL grants for different RNs in a specific RB or RBG is created.

Embodiment 3

In accordance with an embodiment of the present invention, the presence or absence of a UL grant or an (R-) PDSCH is indicated by a DCI RA field bit (or similar information) so that PDSCH data may be decoded successfully. For the convenience' sake, a resource allocation technique described herein conforms to LTE. The RA bit indicates whether a corresponding RB or RBG has been allocated for PDSCH transmission. It is assumed that if the RA bit is set to 0, the corresponding RB or RBG has not been allocated for (R-) PDSCH transmission and if the RA bit is set to 1, the corresponding RB or RBG has been allocated for (R-)PDSCH transmission, or vice versa. The meanings of the RA bit may be interpreted differently for a DL grant and a UL grant.

The DL grant and the UL grant may be located in RBs of different slots. For instance, the DL grant may exist in an RB of the first slot, whereas the UL grant may exist in an RB of the second slot. In this case, resource regions for DL data and the UL grant co-exist. Resources carrying the DL data are indicated by the RA of the DL grant and resources carrying the UL grant are detected by blind decoding. Accordingly, when the RN detects a UL grant in a resource region to which DL data is allocated, the RN receives/decodes the DL data in remaining resources except for resources carrying the UL grant (i.e. rate matching is performed). For the reason, this method is not preferable even though misdetection or false detection of a UL grant may affect DL data decoding.

To overcome the problem, the following constraint may be imposed on eNB-RN communication.

The RN assumes or may assume that a UL grant does not exist in an RB or RBG for which a DL RA bit is set to 1. That is, the RN assumes or may assume that a UL grant can be transmitted only in an RB or RBG with a DL RA bit set to 0. In this example, a part of the resources of the RBG with the DL RA bit set to 0 may be used for data transmission.

The above constraint may ensure accurate rate matching during decoding DL data (i.e. an (R-)PDSCH), even when the RN fails to detect a UL grant (i.e. misdetection) or wrongly detects a UL grant (false notification).

Therefore, the eNB does not a UL grant in an RB or RBG with a DL RA bit set to 1. For example, in case of RA Type 0, the eNB does not transmit a UL grant in an RBG to which DL data for an RN is allocated, except an RBG where a DL grant and a UL grant is co-existent.

Figure 25:
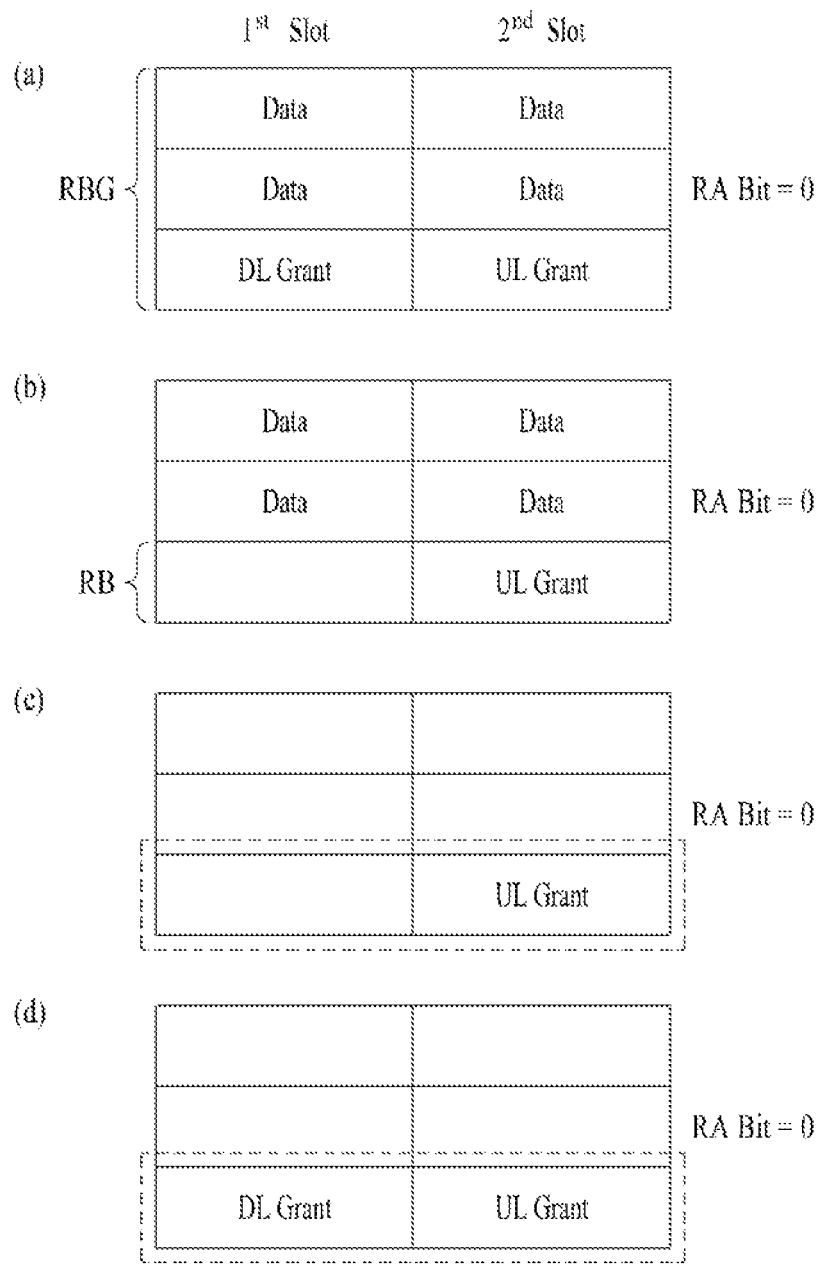
FIG. 25 illustrates an exemplary case of transmitting a UL grant, only when a DL RA bit is set to 0 according to another embodiment of the present invention.

FIG. 25 illustrates an exemplary case where a UL grant is transmitted only when a DL RA bit is set to 0. For the convenience' sake, this example is based on conventional LTE RA Type 0. When the RA bit is set to 1, this implies that a corresponding RBG has been allocated for DL data transmission, as is interpreted conventionally. In contrast, if the RA bit is set to 0, this is interpreted differently from a conventional interpretation. In the example, it is assumed that a DL SS and a UL SS are separately defined.

Referring to FIG. 25, a UL grant may be designed in such a manner that when a DL grant is successfully detected and an RA bit is, for example, 0, the UL grant exists somewhere in an RB or RBG with the RA bit set to 0 in the UL SS. Although a UL SS is configured irrespective of an RA bit, an eNB scheduler may intentionally schedule the existence of a UL grant only in an RB or RBG with an RA bit set to 0. That is, if the RA bit is 0, this may indicate an RBG in which a UL grant can be transmitted and the transmission of the UL grant may be confined to resources that satisfy the UL SS and the RA bit of 0. In this case, the RA bit set to 0 may be understood to indicate a certain subset in an R-PDCCH search space. Therefore, once the RN detects a DL grant, it may limit the search position of a UL grant to resources with an RA bit set to 0 in the UL SS. In other words, RBs or RBGs with an RA bit set to 1 may be excluded from the UL SS.

For this purpose, if the RA bit is 1, the RN assumes that the RB or RBG carries no UL grant. On the other hand, if the RA bit is 0, the RN assumes that a UL grant may be transmitted in the corresponding RB or RBG. In this context, the eNB transmits a UL grant only in an RB or RBG with an RA bit set to 0. When the RN is not aware of the existence/position of a UL grant, it performs blind decoding. When the RN is aware of the existence of a UL grant, it decodes the UL grant at an indicated position. According to the above-described interpretation regarding an RA bit set to 0, the number of blind decodings for a UL grant can be reduced because a UL SS can be dynamically limited (or allocated) using a DL RA.

It has been described above that an RA bit set to 0 indicates resources available to a UL grant. However, this is purely exemplary and thus the RA bit set to 0 may imply that an RB or RBG with the RA bit actually carries a UL grant in a UL SS. In this case, the interpretation of an RA bit set to 0 may be confined to a specific RB or RBG. For instance, the interpretation of an RA bit set to 0 may be confined to an RB or RBG having a DL grant.

Considering data transmission, RA=0 may further be interpreted in the following manners. For instance, an RBG with RA=0 may deliver data when a DL grant or an R-PDCCH exists in the RBG ((a) and (b)). In another example, no data transmission may occur in the RBG with RA=0 irrespective of the presence or absence of an R-PDCCH in the RBG ((c) and (d)).

In FIG. 25, a dotted line represents a case of using RA Type 1. In RA Type 1, an RA bit is interpreted on an RB basis.

Figure 26:
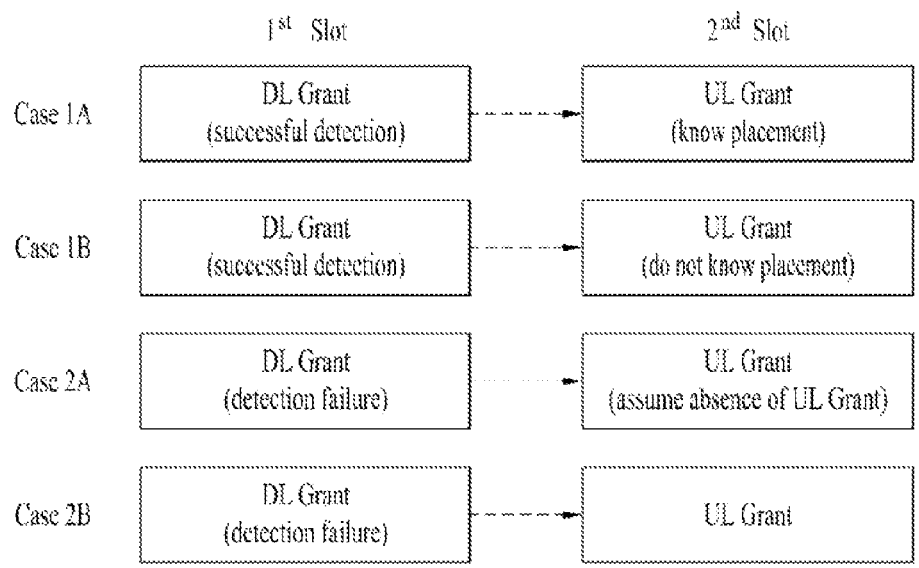
FIGS. 26 to 29 illustrate exemplary scenarios for UL grant blind decoding and methods for performing blind decoding at an RN in the scenarios according to a further embodiment of the present invention.

FIG. 26 illustrates scenarios for UL grant blind decoding.

Referring to FIG. 26, the following cases may be considered depending on whether a DL grant is detected or not.

When an RN detects a DL grant,
Case 1A: the RN is aware of the position of a UL grant.
Case 1B: the RN is not aware of the position of a UL grant.
When the RN fails to detect a DL grant,
Case 2A: the RN assumes the absence of a UL grant. This case is based on the premise that the DL grant indicates the position of the UL grant.
Case 2B: the RN searches for a UL grant in the second slot.

For Case 1A, an appropriate rule may be set so that the position of a UL grant may be indicated by a DL grant. For instance, the DL grant may indicate information about the existence and/or position of the UL grant (shortly, UL grant position information) to the RN explicitly or implicitly. In a method, the existence of the DL grant itself means the UL grant position information. In another method, a type indication field (1 bit) used to distinguish DCI format 0 from DCI format 1A in the legacy LTE system may be used to indicate the UL grant position information. Since the UL grant position information is 1 bit in the first and second methods, only the existence of a UL grant may be indicated. Therefore, the first and second methods are based on the assumption that a certain rule is set between the positions of DL and UL grants. For example, it may be assumed that the DL and UL grants are in the same RB pair. In a third method, the DL grant may include UL grant position information of 2 or more bits. In this case, the UL grant position information may indicate the absence of a UL grant or one of a plurality of UL grant position candidates. In a fourth method, UL grant position information may be indicated by a combination of RRC signaling and a DL grant. For example, one or more of a plurality of UL grant position candidates are indicated by RRC signaling and the absence or actual position of a UL grant is indicated by a DL grant.

Figure 27:
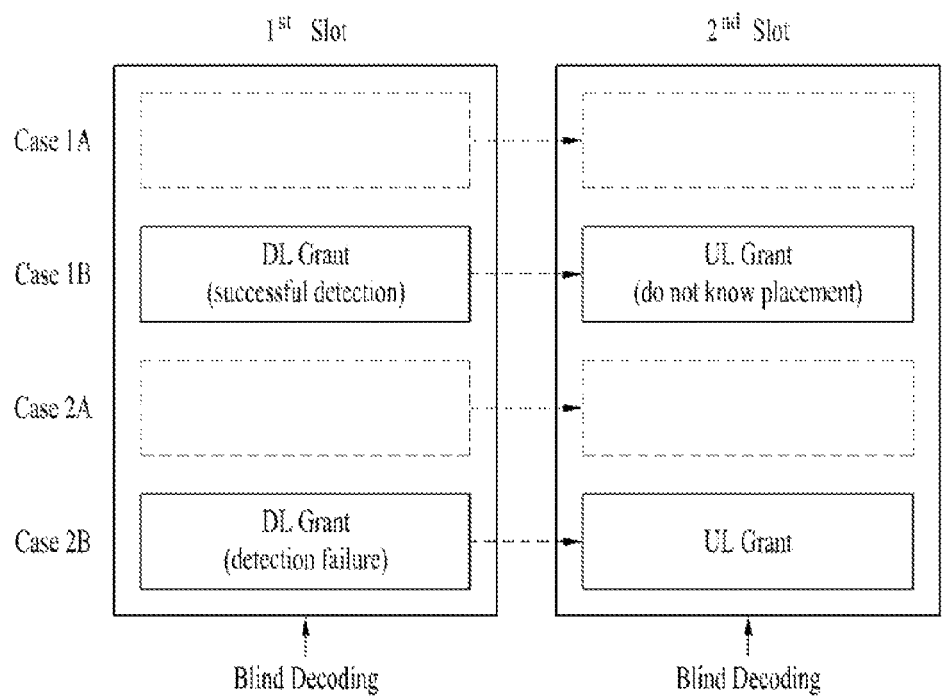
Figure 28:
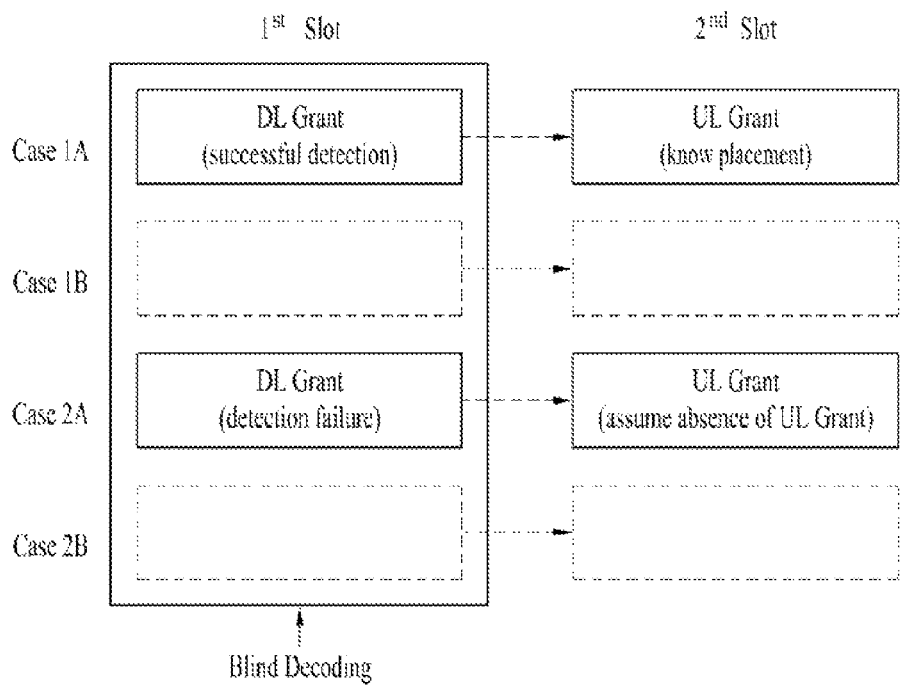
Figure 29:
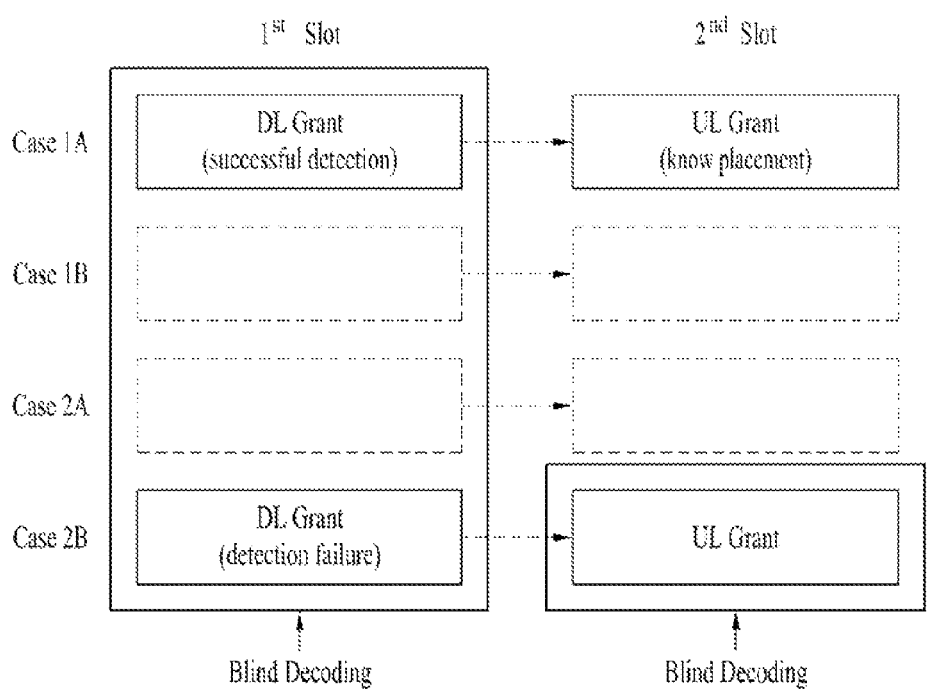

FIGS. 27, 28 and 29 illustrate exemplary blind decoding methods of an RN in the above scenarios. For the convenience' sake, the following description is given in the context of a non-interleaving case. However, the present invention is applicable to an interleaving case in the same manner or in a similar manner.

FIG. 27 illustrates an example of performing blind decoding in the second slot as well as the first slot.

Referring to FIG. 27, an RN performs blind decoding in a DL SS in order to detect a DL grant in the first slot. Then the RN performs blind decoding in a UL SS in order to detect a UL grant in the second slot regardless of whether the DL grant has been detected. Successful detection of a DL grant corresponds to Case 1B and failed detection of a DL grant corresponds to Case 2B. The RA of the DL grant may indicate resource allocation information for an (R-)PDSCH and a part of resources allocated to the (R-)PDSCH may be overlapped with the UL SS. Therefore, a part of resources indicated by the DL RA may be used for UL grant transmission. In this case, the (R-)PDSCH is rate-matched according to the corresponding resources.

In Case 1B, the RN does not know the existence/position of a UL grant. Thus, when the RN fails in blind decoding of a UL grant, the failed blind decoding may affect (R-)PDSCH decoding. For example, misdetection of a UL grant, i.e. failure to detect the UL grant may be mistaken for existence of an (R-)PDSCH in UL grant transmission resources. As a result, an (R-)PDSCH decoding error may be caused because UL grant information is used for (R-)PDSCH decoding. False UL grant detection also leads to a problem. In this case, the RN wrongly determines that a UL grant is present in (R-)PDSCH transmission resources. The resulting exclusion of (R-)PDSCH information corresponding to the UL grant resources during (R-)PDSCH decoding may cause an (R-)PDSCH decoding error. The problems encountered with UL grant misdetection/false detection can be avoided depending on implementation in Case 1B. In an implementation example, it may be regulated that UL grant resources (e.g. a UL SS or actual UL grant transmission resources) should not be allocated to an (R-) PDSCH. However, this imposes a constraint on (R-)PDSCH scheduling. Since a resource allocation unit is large in RA Type 0/2, the scheduling constraint becomes more serious.

In Case 2B, since no DL grant is detected in the first slot, the RN determines that an (R-)PDSCH is not transmitted. Non-detection of a DL grant may amount to actual non-transmission of a DL grant or missing of a DL grant. Since the RN does not perform (R-)PDSCH decoding in either case, the (R-)PDSCH decoding problem caused by misdetection/false detection of a UL grant described in Case 1B is not generated.

FIG. 28 illustrates an example of performing blind decoding only in the first slot.

Referring to FIG. 28, an RN performs blind decoding in a DL SS in order to detect a DL grant in the first slot. On the other hand, the existence/position of a UL grant in the second slot depends on detection of the DL grant. Specifically, the DL grant provides information about the existence/position of a UL grant. In a UL grant-only case, the eNB may transmit a null DL grant for blind decoding in the first slot. Accordingly, if the DL grant is successfully detected in the first slot, the RN can determine the existence/position of the UL grant in the second slot (Case 1A). Since the existence/position of the UL grant is known from the DL grant, the (R-)PDSCH decoding problem described with reference to FIG. 27 does not occur. In contrast, when the RN fails to detect the DL grant in the first slot, the RN does not know the existence/position of a UL grant in the second slot. In this example, if the RN does not know the existence/position of a UL grant due to the failure in detecting the DL grant, the RN assumes that a UL grant is absent in the second slot (Case 2A). Although granted UL resources may be wasted, blind decoding complexity can be reduced from the viewpoint of the RN.

FIG. 29 illustrates an example of performing blind decoding in the first slot and conditional blind decoding in the second slot.

Referring to FIG. 29, the RN performs blind decoding in a DL SS to detect a DL grant in the first slot. In this example, the DL grant provides information about the existence/position of a UL grant. If the RN succeeds in detecting the DL grant in the first slot, the RN can determine the existence/position of the UL grant in the second slot (Case 1A). Because the existence/position of the UL grant is known from the DL grant, the RN can decode the UL grant immediately without depending on blind decoding. As a consequence, the blind decoding complexity of the UL grant can be reduced. In addition, the (R-)PDSCH decoding problem caused by misdetection/false detection of a UL grant as described before with reference to FIG. 27 does not occur.

In contrast, when the RN fails to detect the DL grant in the first slot, the RN does not know the existence/position of the UL grant in the second slot. In this example, if the RN does not know the existence/position of the UL grant due to the failure in detecting the DL grant, the RN performs blind decoding in the UL SS to detect the UL grant in the second slot (Case 2B). Since no DL grant is detected in the first slot, the RN determines that an (R-)PDSCH is not transmitted to the RN. In this case, the (R-)PDSCH decoding problem caused by misdetection/false detection of a UL grant as described before with reference to FIG. 27 does not occur because the RN does not perform (R-)PDSCH decoding.

In a combination of Case 1A and Case 2B, the RN performs blind decoding unconditionally for a DL grant, whereas the RN performs blind decoding for a UL grant under a condition, that is, only when the RN fails in detecting a DL grant. Therefore, the probability of missing a UL grant can be decreased. Further, consumption of UL grant transmission resources or granted UL resources that may be caused by the failure in detecting a UL grant can be minimized.

While the above description is made centering on the relationship between an eNB and an RN, the same thing or a similar thing is applicable to the relationship between an RN and a UE. For instance, the eNB and the RN may be replaced with the RN and the UE, respectively in the above description.

Figure 30:
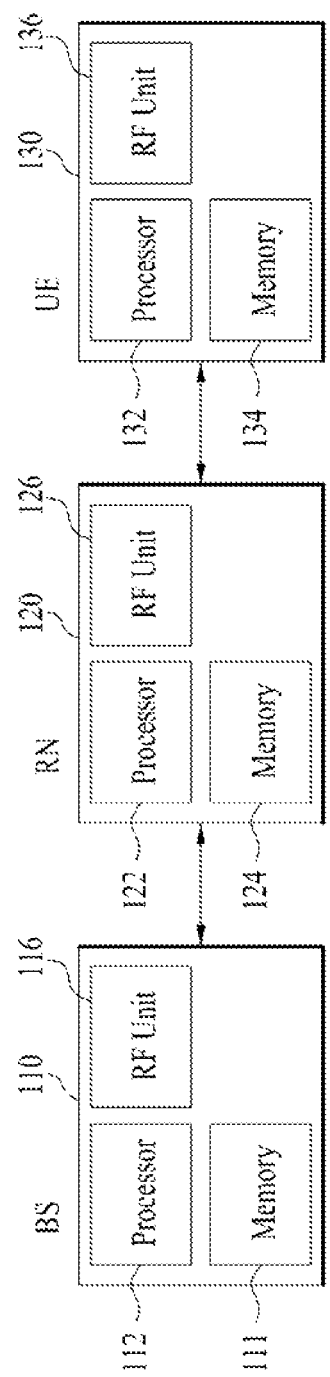
FIG. 30 is a block diagram of a Base Station (BS), an RN, and a User Equipment (UE) which can be applied to the present invention.

FIG. 30 is a block diagram of a BS (or eNB), an RN, and a UE that can be applied to the present invention.

Referring to FIG. 30, a wireless communication system includes a BS 110, an RN 120, and a UE 130. While the UE is shown as connected to the RN in FIG. 30 for the convenience' sake, the UE may be connected to the BS.

The BS 110 includes a processor 112, a memory 114, and a Radio Frequency (RF) unit 116. The processor 112 may be configured so as to implement the proposed procedures and/or methods according to the present invention. The memory 114 is connected to the processor 112 and stores various types of information related to the operations of the processor 112. The RF unit 116 is connected to the processor 112 and transmits and/or receives a radio signal. The RN 120 includes a processor 122, a memory 124, and an RF unit 126. The processor 122 may be configured so as to implement the proposed procedures and/or methods according to the present invention. The memory 124 is connected to the processor 122 and stores various types of information related to the operations of the processor 122. The RF unit 126 is connected to the processor 122 and transmits and/or receives a radio signal. The UE 130 includes a processor 132, a memory 134, and an RF unit 136. The processor 132 may be configured so as to implement the proposed procedures and/or methods according to the present invention. The memory 134 is connected to the processor 132 and stores various types of information related to the operations of the processor 132. The RF unit 136 is connected to the processor 132 and transmits and/or receives a radio signal. The BS 110, the RN 120, and/or the UE 130 may have a single antenna or multiple antennas.

The embodiments of the present invention described above are combinations of elements and features of the present invention. The elements or features may be considered selective unless otherwise mentioned. Each element or feature may be practiced without being combined with other elements or features. Further, an embodiment of the present invention may be constructed by combining parts of the elements and/or features. Operation orders described in embodiments of the present invention may be rearranged. Some constructions of any one embodiment may be included in another embodiment and may be replaced with corresponding constructions of another embodiment. It is obvious to those skilled in the art that claims that are not explicitly cited in each other in the appended claims may be presented in combination as an embodiment of the present invention or included as a new claim by a subsequent amendment after the application is filed.

In the embodiments of the present invention, a description is made, centering on a data transmission and reception relationship among a BS and a UE. In some cases, a specific operation described as performed by the BS may be performed by an upper node of the BS. Namely, it is apparent that, in a network comprised of a plurality of network nodes including a BS, various operations performed for communication with a UE may be performed by the BS, or network nodes other than the BS. The term 'BS' may be replaced with the term, fixed station, Node B, eNode B (eNB), access point, etc.

The embodiments of the present invention may be achieved by various means, for example, hardware, firmware, software, or a combination thereof. In a hardware configuration, an embodiment of the present invention may be achieved by one or more ASICs (application specific integrated circuits), DSPs (digital signal processors), DSDPs (digital signal processing devices), PLDs (programmable logic devices), FPGAs (field programmable gate arrays), processors, controllers, microcontrollers, microprocessors, etc.

In a firmware or software configuration, an embodiment of the present invention may be implemented in the form of a module, a procedure, a function, etc. Software code may be stored in a memory unit and executed by a processor. The memory unit is located at the interior or exterior of the processor and may transmit and receive data to and from the processor via various known means.

Those skilled in the art will appreciate that the present invention may be carried out in other specific ways than those set forth herein without departing from the spirit and essential characteristics of the present invention. The above embodiments are therefore to be construed in all aspects as illustrative and not restrictive. The scope of the invention should be determined by the appended claims and their legal equivalents, not by the above description, and all changes coming within the meaning and equivalency range of the appended claims are intended to be embraced therein.

Industrial Applicability

The present invention relates to a wireless communication system. Particularly, the present invention is applicable to an eNB, an RN and a UE.

The invention claimed is:

1. A method for receiving downlink control information in a wireless communication system, the method comprising:
receiving a subframe including a first slot and a second slot;
detecting a downlink grant including resource allocation bits in the first slot of a resource unit, each bit of the resource allocation bits corresponding to a respective resource unit;
blind decoding a uplink grant in the second slot of the resource unit, if a bit of the resource allocation bits corresponding to the resource unit is set to '0'; and
omitting blind decoding for the uplink grant in the second slot of the resource unit, if the bit of the resource allocation bits corresponding to the resource unit is set to '1'.

2. The method according to claim 1, wherein the resource unit includes a resource block pair.

3. A communication apparatus for receiving downlink control information in a wireless communication system, the communication apparatus comprising:
a Radio Frequency (RF) unit; and
a microprocessor configured to
receive a subframe including a first slot and a second slot,
detect a downlink grant including resource allocation bits in the first slot of a resource unit, each bit of the resource allocation bits corresponding to a respective resource unit,
blind decode a uplink grant in the second slot of the resource unit, if a bit of the resource allocation bits corresponding to the resource unit is set to '0', and
omit blind decoding for the uplink grant in the second slot of the resource unit, if the bit of the resource allocation bits corresponding to the resource unit is set to '1'.

4. The communication apparatus according to claim 3, wherein the resource unit includes a resource block pair.

5. A method for transmitting downlink control information in a wireless communication system, the method comprising:
assigning a downlink grant including resource allocation bits in a first slot of a resource unit, each bit of the resource allocation bits corresponding to a respective resource unit; and
transmitting a subframe including the first slot and a second slot,
wherein the second slot of the resource unit is used as being a potential resource for assignment of a uplink grant, if a bit of the resource allocation bits corresponding to the resource unit is set to '0', and
wherein the second slot of the resource unit is not used for assignment of the uplink grant, if a bit of the resource allocation bits corresponding to the resource unit is set to '1'.

6. The method according to claim 5, wherein the resource unit includes a resource block pair.

7. A communication apparatus for transmitting downlink control information in a wireless communication system, the communication apparatus comprising:
a Radio Frequency (RF) unit; and
a processor configured to
assign a downlink grant including resource allocation bits in a first slot of a resource unit, each bit of the resource allocation bits corresponding to a respective resource unit, and
transmit a subframe including the first slot and a second slot,
wherein the second slot of the resource unit is used as being a potential resource for assignment of a uplink grant, if a bit of the resource allocation bits corresponding to the resource unit is set to '0', and
wherein the second slot of the resource unit is not used for assignment of the uplink grant, if a bit of the resource allocation bits corresponding to the resource unit is set to '1'.

8. The communication apparatus according to claim 5, wherein the resource unit includes a resource block pair.

* * * * *